US009484231B2

United States Patent
Mimura

(10) Patent No.: US 9,484,231 B2
(45) Date of Patent: Nov. 1, 2016

(54) TEMPERATURE CONTROLLER FOR SEMICONDUCTOR MANUFACTURING EQUIPMENT, METHOD FOR CALCULATING PID CONSTANTS IN SEMICONDUCTOR MANUFACTURING, AND METHOD FOR OPERATING TEMPERATURE CONTROLLER FOR SEMICONDUCTOR MANUFACTURING EQUIPMENT

(71) Applicant: KELK LTD., Hiratsuka-shi, Kanagawa (JP)

(72) Inventor: Kazuhiro Mimura, Hiratsuka (JP)

(73) Assignee: KELK Ltd., Kanagawa (JP)

( * ) Notice: Subject to any disclaimer, the term of this patent is extended or adjusted under 35 U.S.C. 154(b) by 84 days.

(21) Appl. No.: 14/414,771

(22) PCT Filed: Jul. 18, 2013

(86) PCT No.: PCT/JP2013/069512
§ 371 (c)(1),
(2) Date: Jan. 14, 2015

(87) PCT Pub. No.: WO2014/017378
PCT Pub. Date: Jan. 30, 2014

(65) Prior Publication Data
US 2015/0206776 A1    Jul. 23, 2015

(30) Foreign Application Priority Data

Jul. 25, 2012 (JP) .................. 2012-165197
Mar. 29, 2013 (JP) .................. 2013-074912

(51) Int. Cl.
*H01L 21/67* (2006.01)
*G05D 23/19* (2006.01)
(52) U.S. Cl.
CPC ..... *H01L 21/67098* (2013.01); *G05D 23/1919* (2013.01); *H01L 21/67248* (2013.01)

(58) Field of Classification Search
CPC ............................... H01L 21/67098
See application file for complete search history.

(56) References Cited

U.S. PATENT DOCUMENTS

| 5,659,388 A | * | 8/1997 | Scheer | ........... G01N 15/065 356/37 |
| 5,996,353 A | * | 12/1999 | Maxwell | ........... B01D 5/0042 62/259.2 |

(Continued)

FOREIGN PATENT DOCUMENTS

| CN | 1236889 | 12/1999 |
| CN | 1923342 | 3/2007 |

(Continued)

OTHER PUBLICATIONS

Shuichi Kurogi et al., "A Thermal Model of the RCA Cleaning System and Adaptive Predictive Temperature Control of Cleaning Solutions", Transactions of the Society of Instrument and Control Engineers, vol. 37, No. 8, pp. 754-762, 2001 (11 pages total, including English Abstract).

(Continued)

*Primary Examiner* — Emmanuel Duke
(74) *Attorney, Agent, or Firm* — Fish & Richardson P.C.

(57) ABSTRACT

A temperature adjustment system configured to adjust the temperature of a fluid used in a semiconductor manufacturing apparatus includes: a heat exchanger including therein a temperature adjuster for heating and cooling the fluid, the heat exchanger being configured to perform heat exchange between the fluid therein and the temperature adjuster; a temperature sensor configured to measure the temperature of the fluid; a PID-constant calculator configured to calculate PID constants for PID control based on the physical properties of the fluid and a time constant of the temperature sensor; and a PID-control calculator configured to perform the PID control on the temperature adjuster with the PID constants calculated by the PID-constant calculator.

7 Claims, 16 Drawing Sheets

(56) References Cited

U.S. PATENT DOCUMENTS

| | | | |
|---|---|---|---|
| 6,148,909 A * | 11/2000 | Osanai | G05D 23/1919 165/263 |
| 2001/0052409 A1 | 12/2001 | Miki | |
| 2003/0084730 A1* | 5/2003 | Komine | G01N 3/08 73/798 |
| 2004/0244384 A1* | 12/2004 | Yamazaki | H01L 21/67248 62/3.2 |
| 2005/0140959 A1* | 6/2005 | Tsuji | G03F 7/70858 355/72 |
| 2006/0130737 A1* | 6/2006 | Wakabayashi | C30B 15/203 117/13 |
| 2006/0201172 A1 | 9/2006 | Kaneko et al. | |
| 2007/0204610 A1* | 9/2007 | Hatta | H01L 21/68714 60/520 |
| 2008/0060214 A1 | 3/2008 | Nishimura et al. | |
| 2008/0098750 A1* | 5/2008 | Busier | F24H 4/04 62/3.3 |
| 2008/0223850 A1 | 9/2008 | Nakao | |
| 2008/0245306 A1 | 10/2008 | Nakao et al. | |
| 2008/0257537 A1* | 10/2008 | Hatta | G05D 23/1919 165/263 |
| 2009/0095422 A1* | 4/2009 | Sugishita | C23C 16/4411 156/345.27 |
| 2009/0177310 A1* | 7/2009 | Dao | G05B 11/42 700/121 |
| 2010/0314070 A1 | 12/2010 | Yang | |
| 2011/0066294 A1* | 3/2011 | Takechi | H01L 21/67005 700/282 |
| 2011/0108195 A1 | 5/2011 | Nishimoto | |
| 2011/0274404 A1* | 11/2011 | Okada | C03B 37/02718 385/141 |

FOREIGN PATENT DOCUMENTS

| | | |
|---|---|---|
| CN | 101266922 | 9/2008 |
| CN | 101285178 | 10/2008 |
| CN | 101932220 | 12/2010 |
| CN | 102084727 | 6/2011 |
| JP | S60-151709 A | 8/1985 |
| JP | 05-80806 A | 4/1993 |
| JP | H11-211191 A | 8/1999 |
| JP | 2007027391 A | 2/2007 |
| JP | 2008066535 A | 3/2008 |
| JP | 2009116515 A | 5/2009 |

OTHER PUBLICATIONS

International Search Report dated Oct. 22, 2013 from International Application No. PCT/JP2013/069512, 4 pages.

Office Action in Chinese Application No. 201380039566.9, issued Mar. 16, 2016, 12 pages, with English translation.

* cited by examiner

TEMPERATURE CONTROLLER FOR SEMICONDUCTOR MANUFACTURING EQUIPMENT, METHOD FOR CALCULATING PID CONSTANTS IN SEMICONDUCTOR MANUFACTURING, AND METHOD FOR OPERATING TEMPERATURE CONTROLLER FOR SEMICONDUCTOR MANUFACTURING EQUIPMENT

CROSS-REFERENCE TO RELATED APPLICATIONS

This application claims priority to International Application No. PCT/JP2013/069512 filed on Jul. 18, 2013, which application claims priority to Japanese Patent Application No. 2012-165197, filed on Jul. 25, 2012, and Japanese Patent Application No. 2013-074912, filed Mar. 29, 2013, the contents of which applications are incorporated herein by reference in their entireties.

TECHNICAL FIELD

The present invention relates to a temperature adjustment system for a semiconductor manufacturing apparatus, a PID-constant calculating method for semiconductor manufacturing, and a method for operating the temperature adjustment system for the semiconductor manufacturing apparatus.

BACKGROUND ART

A typical semiconductor manufacturing apparatus includes a temperature adjustment system using a PID (Proportional-Integral-Derivative) control to adjust the temperature of a chemical solution in a chemical solution bath for etching or the like, or to adjust the temperature of a chemical solution used in, for instance, a single-wafer cleaner for semiconductors (see, for instance, Patent Literature 1).

In the PID control, PID constants such as a proportional gain Kp, an integral time Ti and a derivative time Td are determined and the temperature control system is controlled with the determined PID constants.

As typically known, the PID constants are determined by: (1) repeating a manual trial and error approach; (2) conducting an experiment; (3) using an auto-tuning function provided to the temperature adjustment system; or (4) adjusting the PID constants using a self-tuning function provided to the temperature adjustment system during operation.

CITATION LIST

Patent Literature(s)

Patent Literature 1: JP-A-05-80806

SUMMARY OF THE INVENTION

Problem(s) to be Solved by the Invention

The above determination methods (1) to (3), however, require a tuning process prior to the start of an operation, so that it takes time before the operation is started.

The determination method (4), which is based on a step-response method, requires a heating allowance not less than a normal proportional band due to the necessity of an appropriate measurement section. Further, the adjustment is performed during operation, so that optimum values cannot always be obtained immediately after the start of the operation and thus it is difficult to deal with transient characteristics such as overshoot.

In particular, the above problems are critical for semiconductor manufacturing because whenever the recipe of a chemical solution or the like (an object to be subjected to a temperature control) is changed, the PID constants have to be tuned to be optimum for each recipe.

An object of the invention is to provide a temperature adjustment system for a semiconductor manufacturing apparatus, a PID-constant calculating method for semiconductor manufacturing, and a method for operating the temperature adjustment system for the semiconductor manufacturing apparatus, which are capable of promptly determining the PID constants upon the necessity of readjusting the PID constants so that an operation can be started in a short time.

Means for Solving the Problem(s)

According to a first aspect of the invention, a temperature adjustment system for a semiconductor manufacturing apparatus, the temperature adjustment system being configured to adjust a temperature of a fluid used in the semiconductor manufacturing apparatus, the temperature adjustment system includes: a heat exchanger including therein a temperature adjuster for heating and cooling the fluid, the heat exchanger being configured to perform heat exchange between the fluid therein and the temperature adjuster; a temperature sensor configured to measure the temperature of the fluid; a PID-constant calculator configured to calculate PID constants for PID control based on physical properties of the fluid and a time constant of the temperature sensor; and a PID-control calculator configured to perform the PID control on the temperature adjuster with the PID constants calculated by the PID-constant calculator.

According to a second aspect of the invention related to the first aspect, the semiconductor manufacturing apparatus is an open-loop semiconductor manufacturing apparatus configured to discharge the fluid with the adjusted temperature after being used for a treatment, and the PID-constant calculator calculates the PID constants from: a flow rate of the fluid; a density and a specific heat of the fluid; and a capacity of the heat exchanger.

According to a third aspect of the invention related to the first aspect, the semiconductor manufacturing apparatus is a closed-loop semiconductor manufacturing apparatus including a treatment bath for treating a semiconductor, the treatment bath being supplied with the fluid with the adjusted temperature, the fluid being recycled from the treatment bath after being used for treating the semiconductor and again subjected to a temperature adjustment, and the PID-constant calculator calculates the PID constants from: a circulation flow rate of the fluid; a density and a specific heat of the fluid; a capacity of the heat exchanger; a heat loss coefficient in a form of a function of a deviation between a temperature setpoint of the fluid and an ambient temperature; a capacity of a duct of the semiconductor manufacturing apparatus through which the fluid flows; and a fluid volume in the treatment bath.

According to a fourth aspect of the invention related to any one of the first to third aspects, the temperature adjuster is a halogen lamp heater including a closed sheath pipe in which halogen gas is contained and a filament is inserted.

According to a fifth aspect of the invention related to any one of the first to third aspects, the temperature adjuster is a halogen lamp heater including a sheath heater including a sheath pipe in which a Nichrome wire is inserted.

According to a sixth aspect of the invention related to any one of the first to third aspects, the temperature adjuster includes a Peltier element.

According to a seventh aspect of the invention, a PID-constant calculating method for semiconductor manufacturing using a semiconductor temperature adjustment system for a semiconductor manufacturing apparatus, the temperature adjustment system being configured to adjust a temperature of a fluid used in the semiconductor manufacturing apparatus, the temperature adjustment system including a heat exchanger comprising therein a temperature adjuster for heating and cooling the fluid, the heat exchanger being configured to perform heat exchange between the fluid therein and the temperature adjuster, the semiconductor manufacturing apparatus being a closed-loop semiconductor manufacturing apparatus including a treatment bath for treating a semiconductor, the treatment bath being supplied with the fluid with the adjusted temperature, the fluid being recycled from the treatment bath after being used for treating the semiconductor and again subjected to a temperature adjustment, the method includes calculating PID constants for PID control including a proportional gain (Kp), an integral time (Ti) and a derivative time (Td) from the following variables using a transfer function $G_1(s)$ represented by a formula (1) below.

a capacity of the heat exchanger: V1 (m$^3$)
    an output of the temperature adjuster: P (kW)
    a coefficient matching a type of the temperature adjuster: $\gamma$ ($\geq 1$)
    a time constant of a temperature sensor: Tsen (sec)
    a heat loss coefficient of the treatment bath: $\alpha$ (1/sec)
    a circulation flow rate of the fluid: q (m$^3$/sec)
    a flow volume in the treatment bath: Vb (m$^3$)
    a specific heat of the fluid: Cp (J/(kg·K))
    a density of the fluid: $\rho$ (kg/m$^3$)
    a temperature setpoint of the fluid: Sv (K)
    an ambient temperature around the apparatus: Tr (K)
    a capacity of a duct of the apparatus: Vp (m$^3$)

Numerical Formula 1

$$G_1(s) = \frac{(V1s+q)}{(\gamma V1s+q)} \cdot \frac{P(q-\alpha Vb)/\rho Cp}{(V1Vbs^2+(V1+Vb)qs+\alpha Vbq)} \cdot \frac{1}{(Tsens+1)} \cdot e^{-Ls} \quad (1)$$

$$(L = Vp/q)$$

According to an eighth aspect of the invention, a method for calculating PID constants in semiconductor manufacturing using a semiconductor temperature adjustment system for a semiconductor manufacturing apparatus, the temperature adjustment system being configured to adjust a temperature of a fluid used in the semiconductor manufacturing apparatus, the temperature adjustment system including a heat exchanger including therein a temperature adjuster for heating and cooling the fluid, the heat exchanger being configured to perform heat exchange between the fluid therein and the temperature adjuster, the semiconductor manufacturing apparatus being an open-loop semiconductor manufacturing apparatus configured to discharge the fluid with the adjusted temperature after being used for a treatment, the method includes calculating PID constants for PID control including a proportional gain (Kp), an integral time (Ti) and a derivative time (Td) from the following variables using a transfer function $G_2(s)$ represented by a formula (2) below.

a capacity of the heat exchanger: V1 (m$^3$)
    an output of the temperature adjuster: P (kW)
    a coefficient matching a type of the temperature adjuster: $\gamma$ ($\geq 1$)
    a time constant of a temperature sensor: Tsen (sec)
    a flow rate of the fluid: q (m$^3$/sec)
    a fluid usage: Vb (m$^3$)
    a specific heat of the fluid: Cp (J/(kg·K))
    a density of the fluid: $\rho$ (kg/m$^3$)
    a temperature setpoint of the fluid: Sv (K)
    an ambient temperature around the apparatus: Tr (K)
    a capacity of a duct from an outlet of the heat exchanger to the temperature sensor: Vp (m$^3$)

Numerical Formula 2

$$G_2(s) = \frac{P}{(\gamma V1 \rho Cps + q\rho Cp)} \cdot \frac{1}{(Tsens+1)} \cdot e^{-Ls} \quad (2)$$

$$= \frac{K \cdot e^{-Ls}}{(T_1 s + 1)(T_2 s + 1)}$$

$$(L = Vp/q)$$

According to a ninth aspect of the invention related to the third aspect, the temperature adjustment system for the semiconductor manufacturing apparatus further includes: a transfer function model generator configured to generate a plurality of transfer function models from an original transfer function model used by the PID-constant calculator to calculate the PID constants by varying the fluid volume in the treatment bath of the original transfer function model; an input/output data storage configured to store a manipulated variable corresponding to temperature data obtained by a temperature sensor configured to measure the temperature of the fluid in the treatment bath every predetermined time when the PID-control calculator performs the PID control on the temperature adjuster with the PID constants calculated by the PID-constant calculator; a transfer function model selector configured to: calculate a deviation between an output result upon inputting the manipulated variable stored in the input/output data storage to each of the transfer function models generated by the transfer function model generator and the temperature of the fluid in the treatment bath stored in the input/output data storage; and select one of the transfer function models with a smallest deviation; and a transfer function model corrector configured to correct the original transfer function model with reference to the one of the transfer function models selected by the transfer function model selector.

According to a tenth aspect of the invention, a method for operating a temperature adjustment system for a semiconductor manufacturing apparatus, the temperature adjustment system being configured to adjust a temperature of a fluid used in the semiconductor manufacturing apparatus, the temperature adjustment system including a heat exchanger including therein a temperature adjuster for heating and cooling the fluid, the heat exchanger being configured to perform heat exchange between the fluid therein and the temperature adjuster, the semiconductor manufacturing apparatus being a closed-loop semiconductor manufacturing apparatus including a treatment bath for treating a semiconductor, the treatment bath being supplied with the fluid with the adjusted temperature, the fluid being recycled from the treatment bath after being used for treating the semiconductor and again subjected to a temperature adjustment, the method includes: calculating PID constants for PID control including a proportional gain (Kp), an integral time (Ti) and a derivative time (Td) from the following variables using a transfer function $G_1(s)$ represented by a formula (1) below, a capacity of the heat exchanger: V1 ($m^3$)
an output of the temperature adjuster: P (kW)
a coefficient matching a type of the temperature adjuster: $\gamma$ ($\geq 1$)
a time constant of a temperature sensor: Tsen (sec)
a heat loss coefficient of the treatment bath: $\alpha$ (1/sec)
a circulation flow rate of the fluid: q ($m^3$/sec)
a flow volume in the treatment bath: Vb ($m^3$)
a specific heat of the fluid: Cp (J/(kg·K))
a density of the fluid: $\rho$ (kg/$m^3$)
a temperature setpoint of the fluid: Sv (K)
an ambient temperature around the apparatus: Tr (K)
a capacity of a duct of the apparatus: Vp ($m^3$);

generating a plurality of transfer function models by varying the fluid volume Vb ($m^3$) in the treatment bath of the formula (1); measuring and storing the temperature of the fluid in the treatment bath and a manipulated variable every predetermined time when the PID control is performed on the temperature adjuster with the PID constants calculated in the calculating of the PID constants; operating the temperature adjustment system for the semiconductor manufacturing apparatus with the calculated PID constants; calculating a deviation between an output result of each of the generated plurality of transfer function models and the measured temperature of the fluid in the treatment bath; selecting one of the transfer function models with a smallest deviation; and correcting the calculated PID constants with reference to the selected one of the transfer function models.

Numerical Formula 3

$$G_1(s) = \frac{(V1s+q)}{(\gamma V1s+q)} \cdot \frac{P(q-\alpha Vb)/\rho Cp}{(V1Vbs^2+(V1+Vb)qs+\alpha Vbq)} \cdot \frac{1}{(Tsens+1)} \cdot e^{-Ls} \quad (1)$$

$$(L = Vp/q)$$

According to an eleventh aspect of the invention related to the tenth aspect, the method for operating the temperature adjustment system for the semiconductor manufacturing apparatus further includes: acquiring an input manipulated variable for the temperature adjuster after the temperature of the fluid in the treatment bath is settled at the temperature setpoint; and correcting the heat loss coefficient $\alpha$ of the treatment bath with the acquired input manipulated variable for the temperature adjuster.

In the first aspect of the invention, the PID-constant calculator calculates the PID constants by simulation prior to the operation of the semiconductor manufacturing apparatus, so that the operation of the semiconductor manufacturing apparatus can be promptly started without the necessity of spending time, for instance, tuning prior to the operation.

The invention is remarkably effective especially for a semiconductor manufacturing apparatus in which the recipe of a fluid is frequently changed.

In the second aspect of the invention, the temperature adjustment system for the semiconductor manufacturing apparatus according to the invention is used for an open-loop semiconductor manufacturing apparatus. For instance, the temperature adjustment system is suitably usable for a single-wafer spinning cleaner.

In the third aspect of the invention, the temperature adjustment system for the semiconductor manufacturing apparatus according to the invention is used for a closed-loop semiconductor manufacturing apparatus. For instance, the temperature adjustment system is suitably usable for a batch-type etching bath.

In the fourth and fifth aspects of the invention, a halogen heater and a sheath heater, which are relatively easily available and inexpensive, are used. Such heaters may be replaced by one with a different output as needed to change a temperature adjustable range available by the temperature adjustment system for the semiconductor manufacturing apparatus.

In the sixth aspect of the invention, the temperature adjuster includes a Peltier element, so that the fluid can be heated or cooled as desired by reversing the polarity of electric current applied to the Peltier element in the heat exchanger. The temperature adjustment system for the semiconductor manufacturing apparatus can thus promptly adjust the temperature of the fluid with high accuracy.

The seventh and eighth aspects of the invention can provide effects similar to those of the first aspect.

In the ninth aspect of the invention, a transfer model generator generates a plurality of transfer function models, the temperature of the fluid in the treatment bath is measured during an actual temperature adjustment, the transfer function model selector selects one of the transfer function models with an output result least deviated from the actual temperature transition of the fluid, and the PID-constant calculator corrects the PID constants with reference to a transfer function model corrected by the transfer function model corrector. As a result, the temperature adjustment system for the semiconductor manufacturing apparatus can perform the PID control with further improved accuracy, which results in reducing a time required to initially boot up the semiconductor manufacturing apparatus, a time required to change the procedure during operation, and a time required to change the recipe of the fluid in the treatment bath.

The tenth aspect of the invention can provide effects similar to those of the ninth aspect.

In the eleventh aspect of the invention, after the temperature of the fluid is actually settled at the temperature setpoint, the input manipulated variable for the temperature adjuster is acquired and the heat loss coefficient $\alpha$ of the treatment bath is corrected with the input manipulated variable, which results in further reducing a time required to initially boot up the equipment for the next operation. Moreover, the heat loss coefficient $\alpha$ can be changed depending on an external disturbing factor (e.g., a seasonal variation) to further improve the accuracy of the PID control.

BRIEF DESCRIPTION OF DRAWING(S)

FIG. 1 schematically illustrates an arrangement of a semiconductor manufacturing apparatus according to a first exemplary embodiment of the invention.

Figure 3:
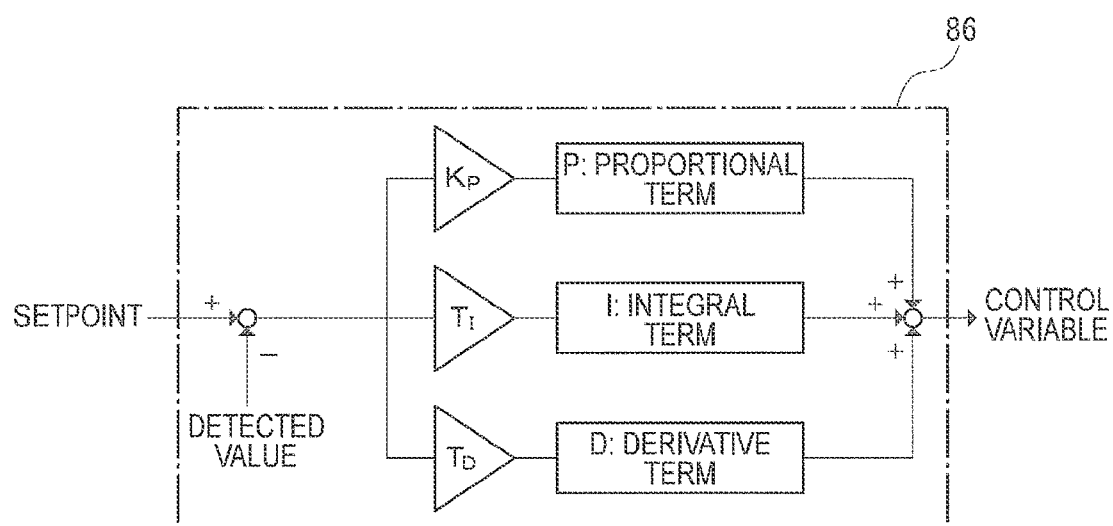

FIG. 3 schematically illustrates an arrangement of a PID-control calculator according to the first exemplary embodiment.

Figure 4:
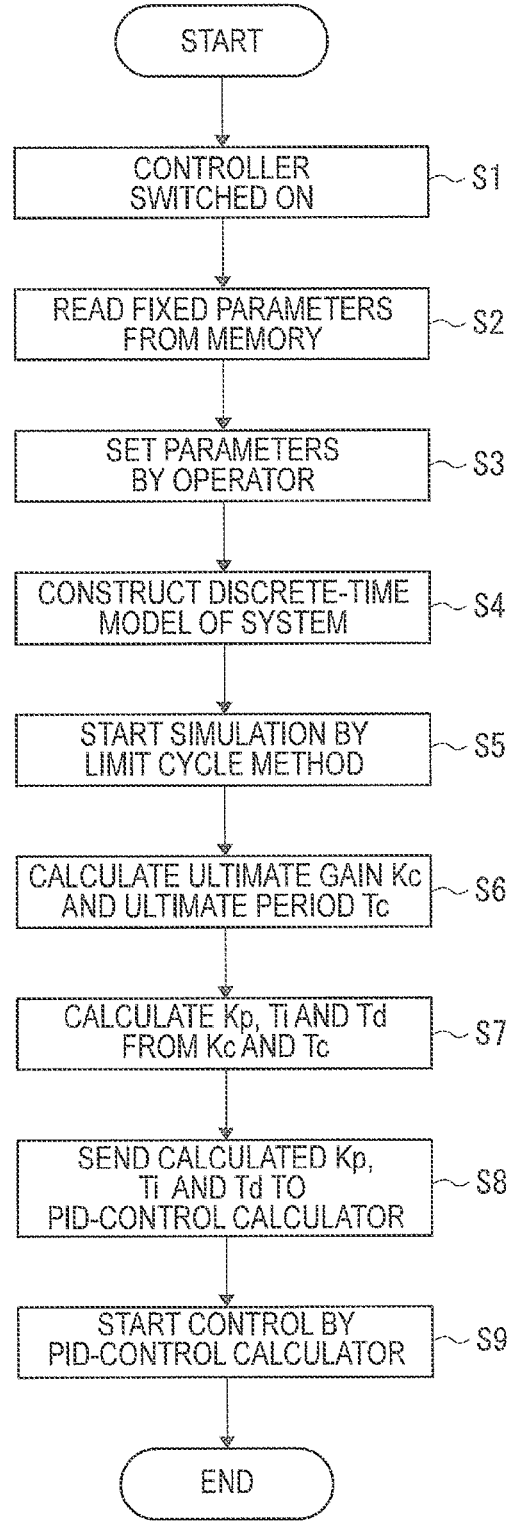

FIG. 4 is a flow chart illustrating effects of the first exemplary embodiment.

Figure 5:
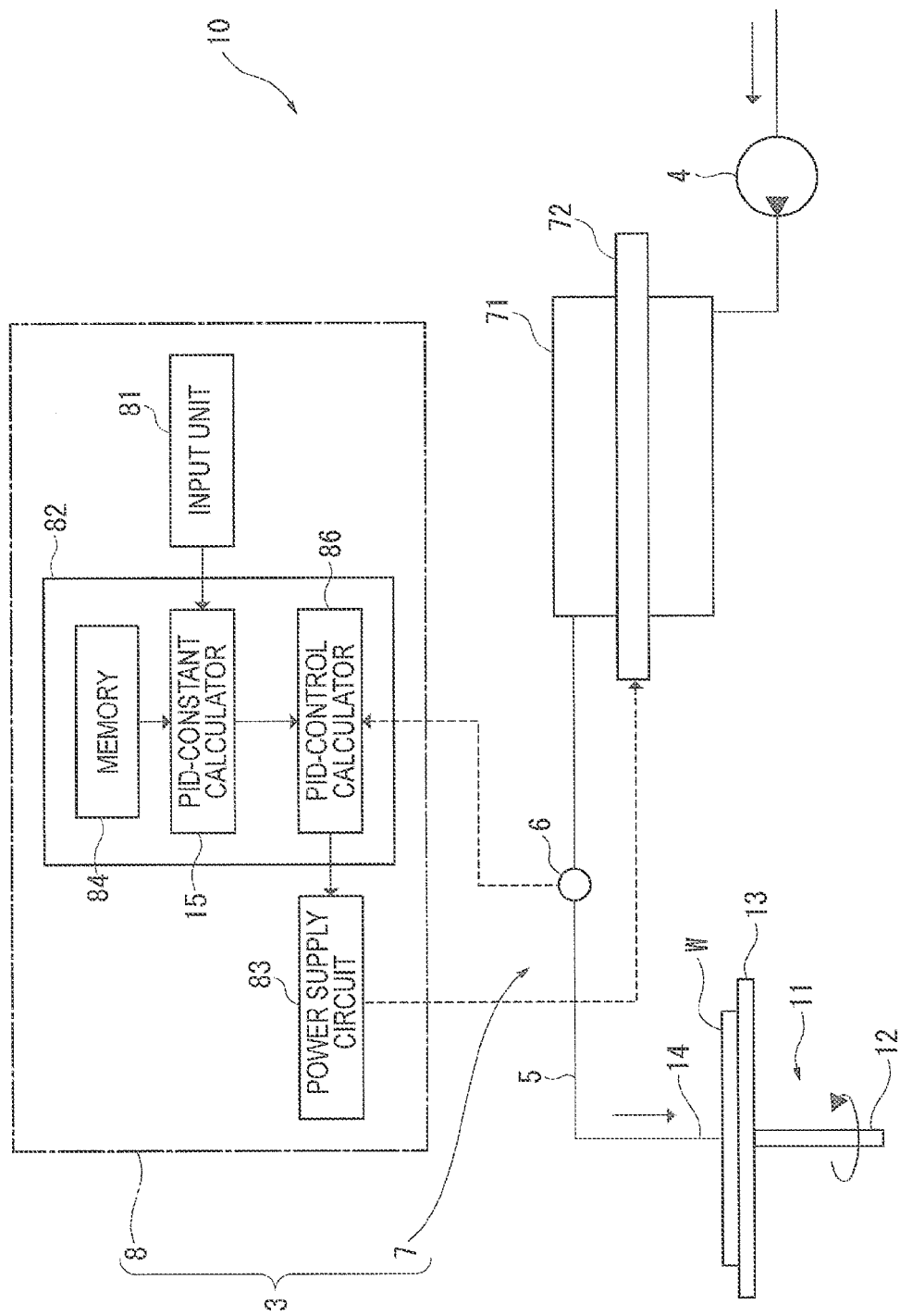

FIG. 5 schematically illustrates an arrangement of a semiconductor manufacturing apparatus according to a second exemplary embodiment of the invention.

Figure 6:
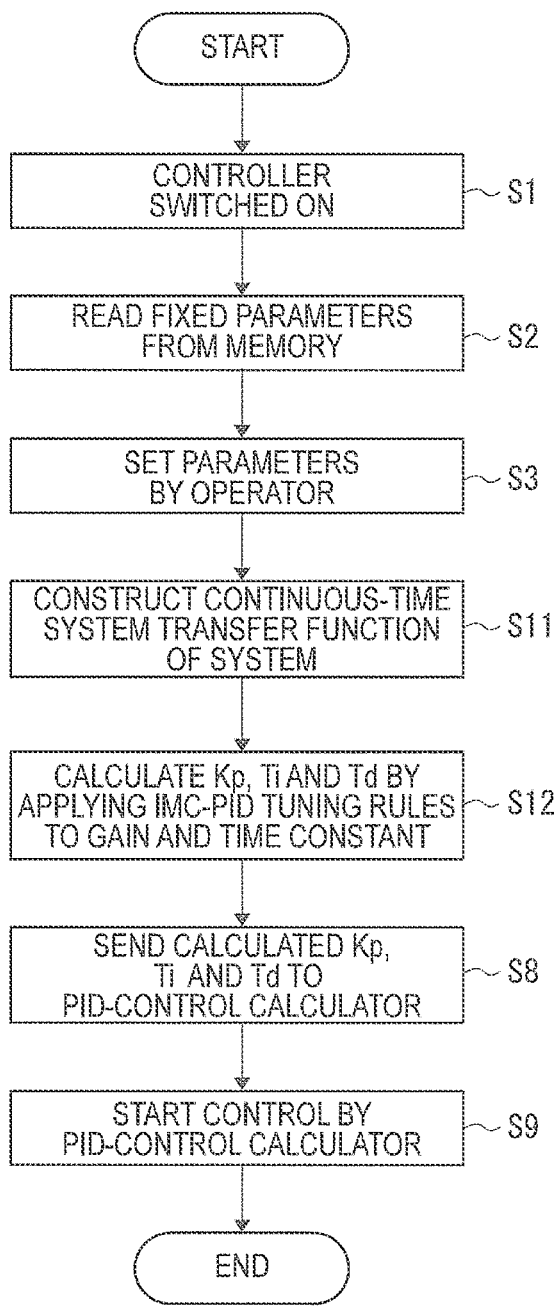

FIG. 6 is a flow chart illustrating effects of the second exemplary embodiment.

Figure 7:
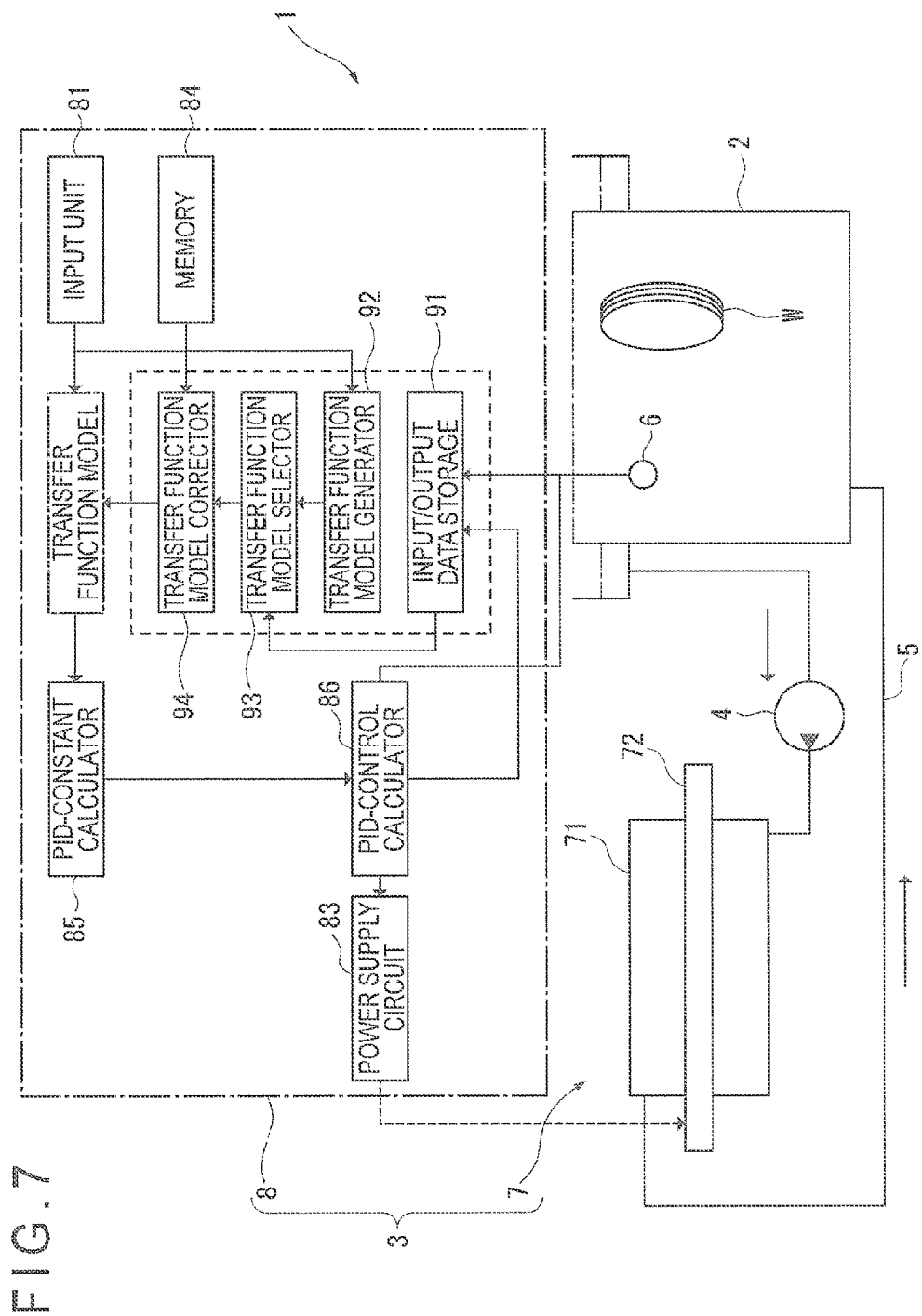

FIG. 7 schematically illustrates an arrangement of a semiconductor manufacturing apparatus according to a third exemplary embodiment of the invention.

Figure 8:
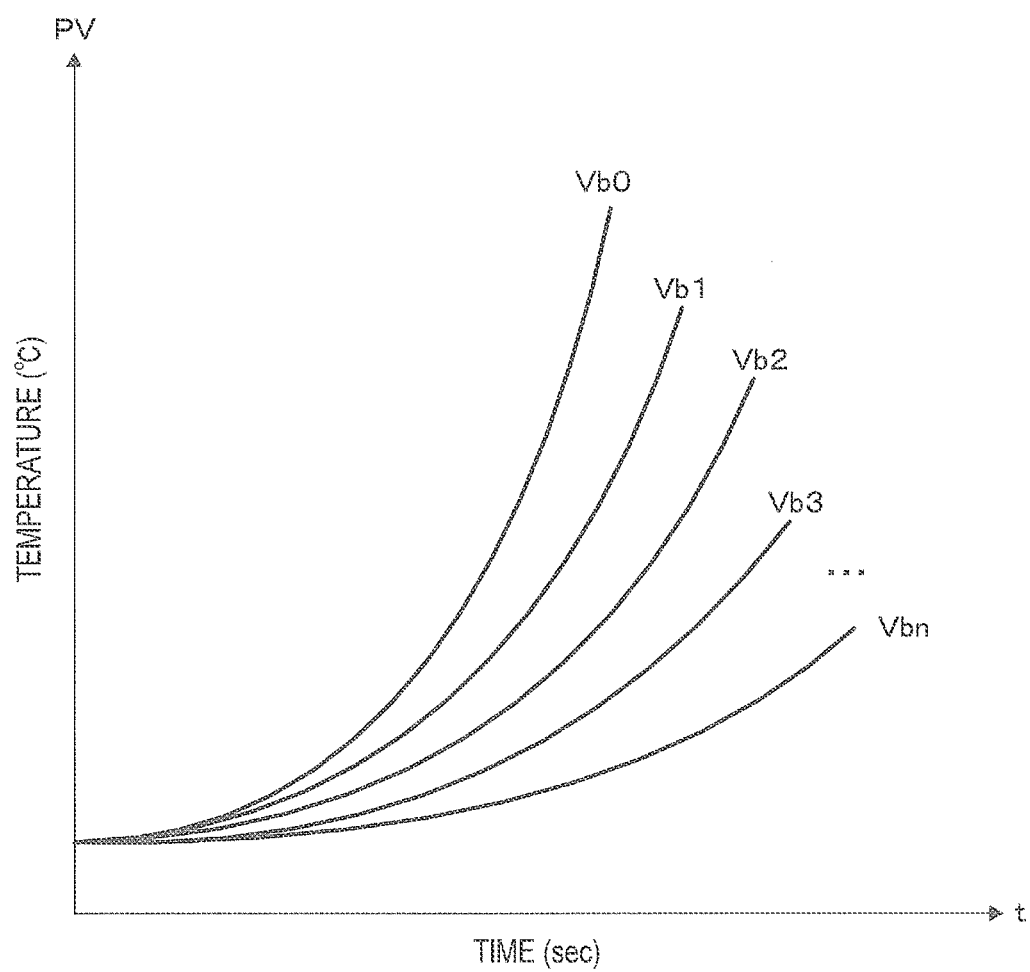

FIG. 8 is a graph illustrating a plurality of transfer function models generated by a transfer function model generator according to the third exemplary embodiment.

Figure 9:
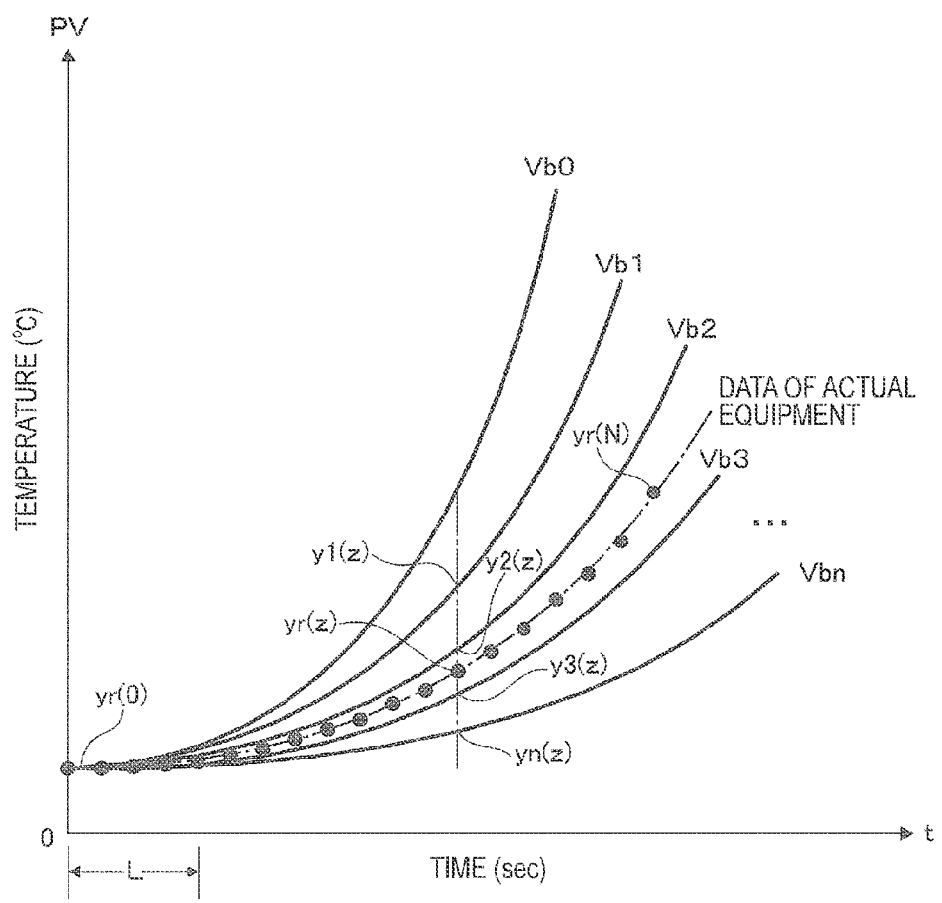

FIG. 9 illustrates a method for a transfer function model selector to select one of the transfer function models according to the third exemplary embodiment.

Figure 10:
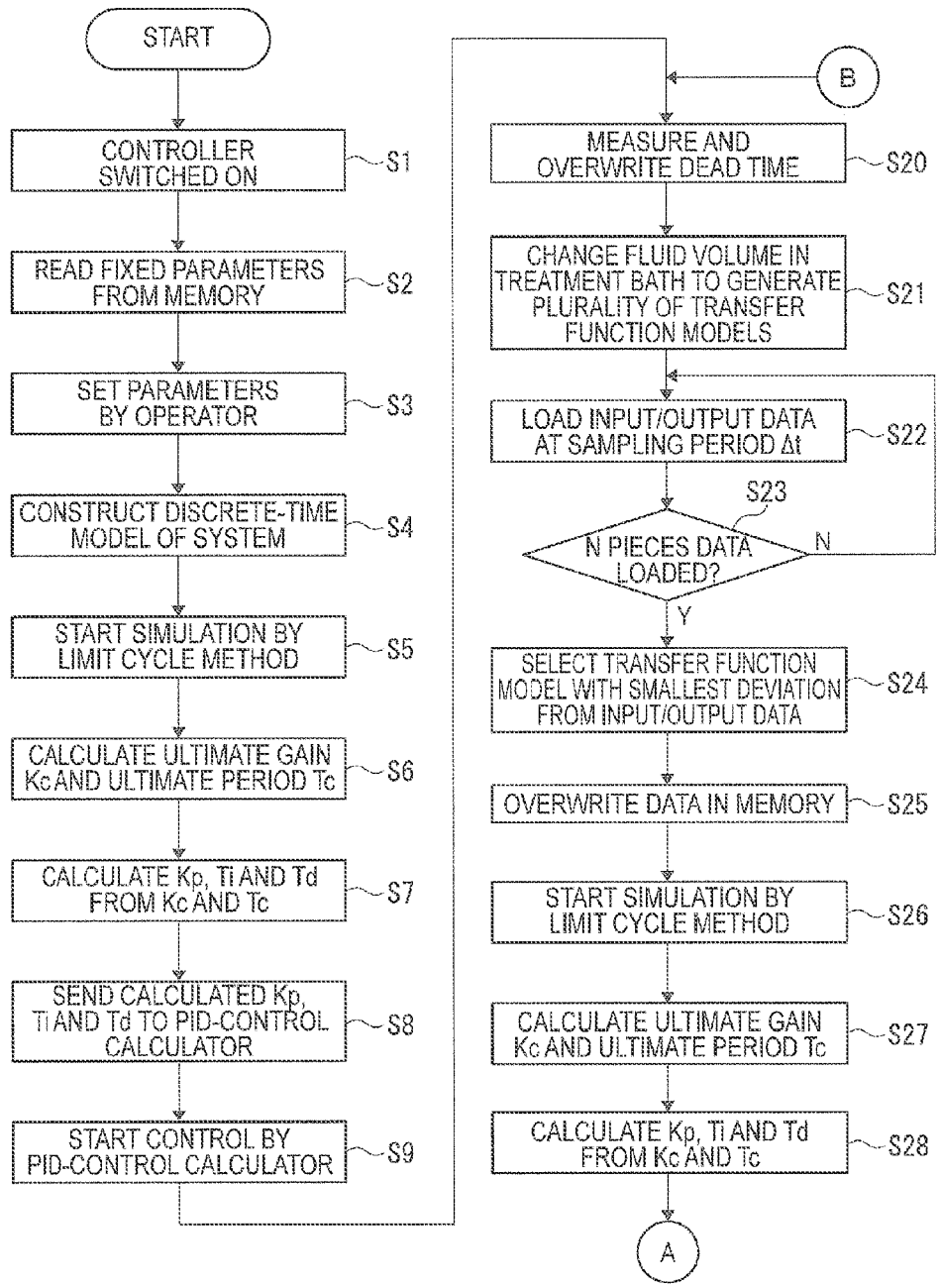

FIG. 10 is a flow chart illustrating effects of the third exemplary embodiment.

Figure 11:
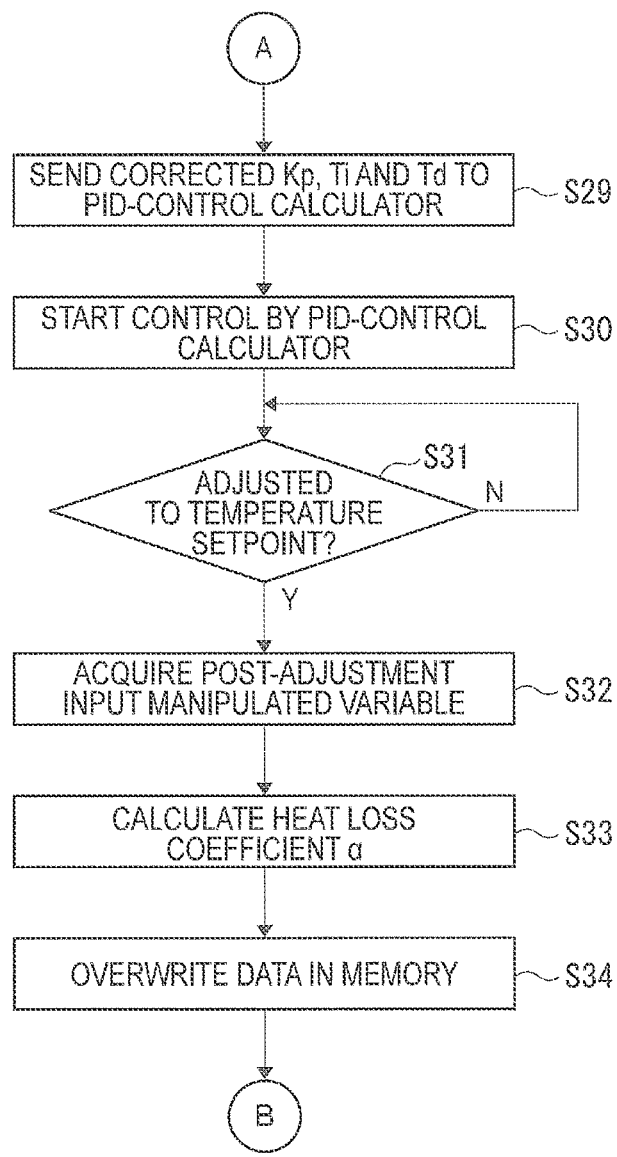

FIG. 11 is a flow chart illustrating effects of the third exemplary embodiment.

Figure 12:
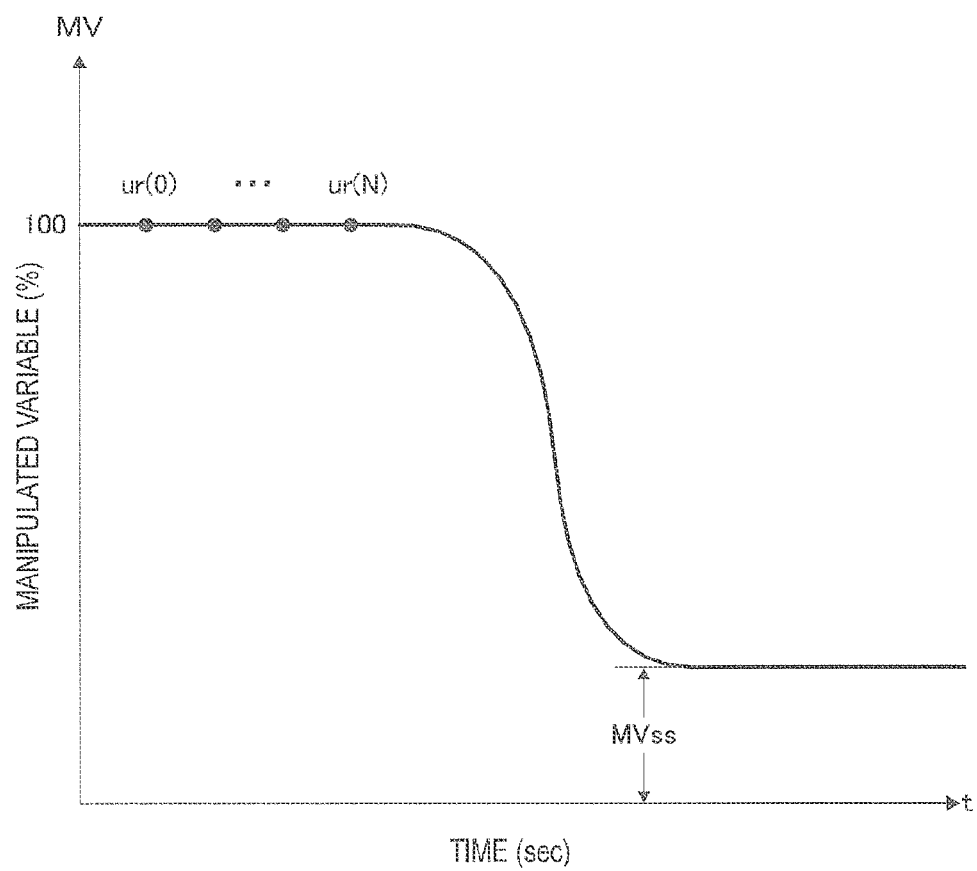

FIG. 12 is a graph illustrating a post-settlement input manipulated variable for correcting a heat loss coefficient α according to the third exemplary embodiment.

Figure 13:
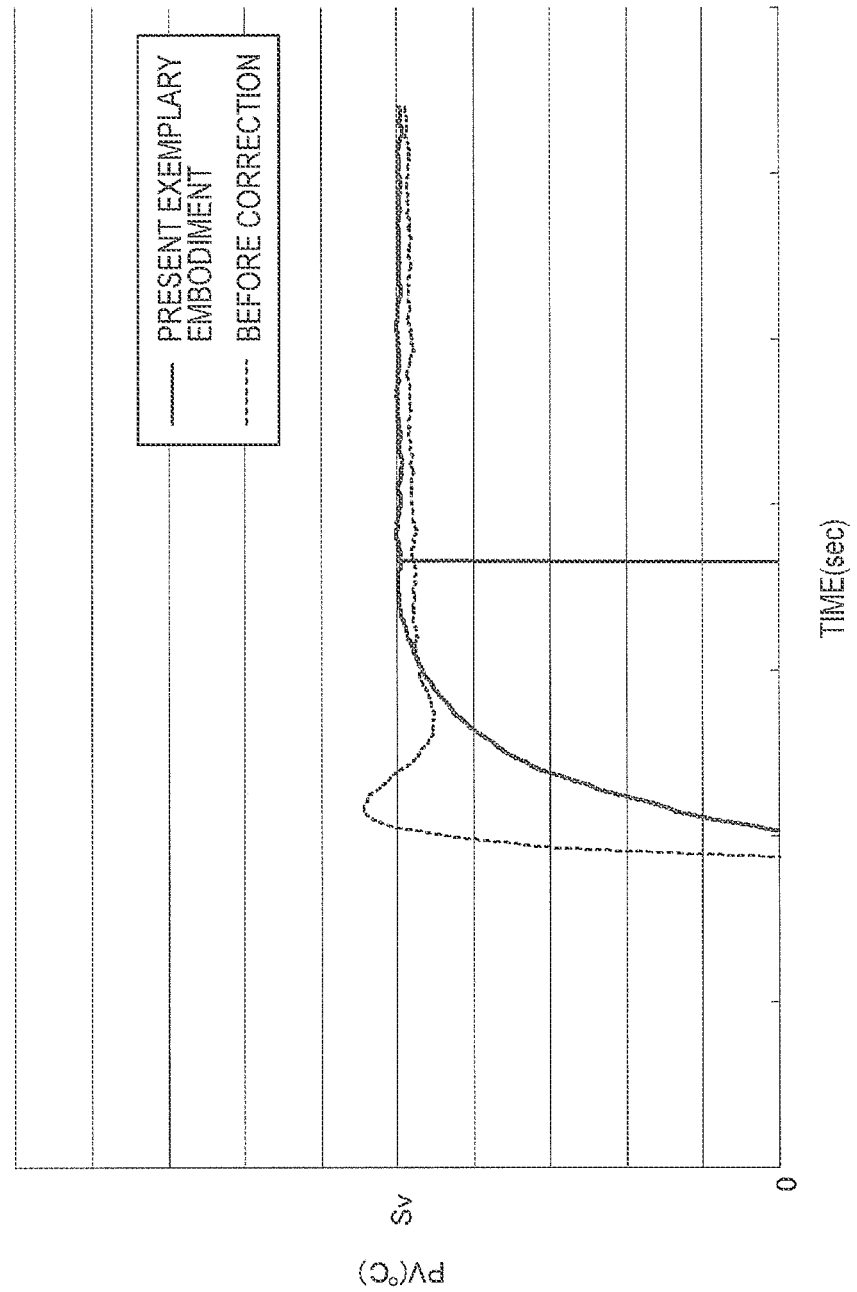

FIG. 13 is a graph illustrating temperature transitions of a fluid in a treatment bath until the temperature of the fluid is settled at a temperature setpoint in the case of the PID constants being uncorrected and in the case of the PID constants being corrected, according to the third exemplary embodiment.

Figure 14:
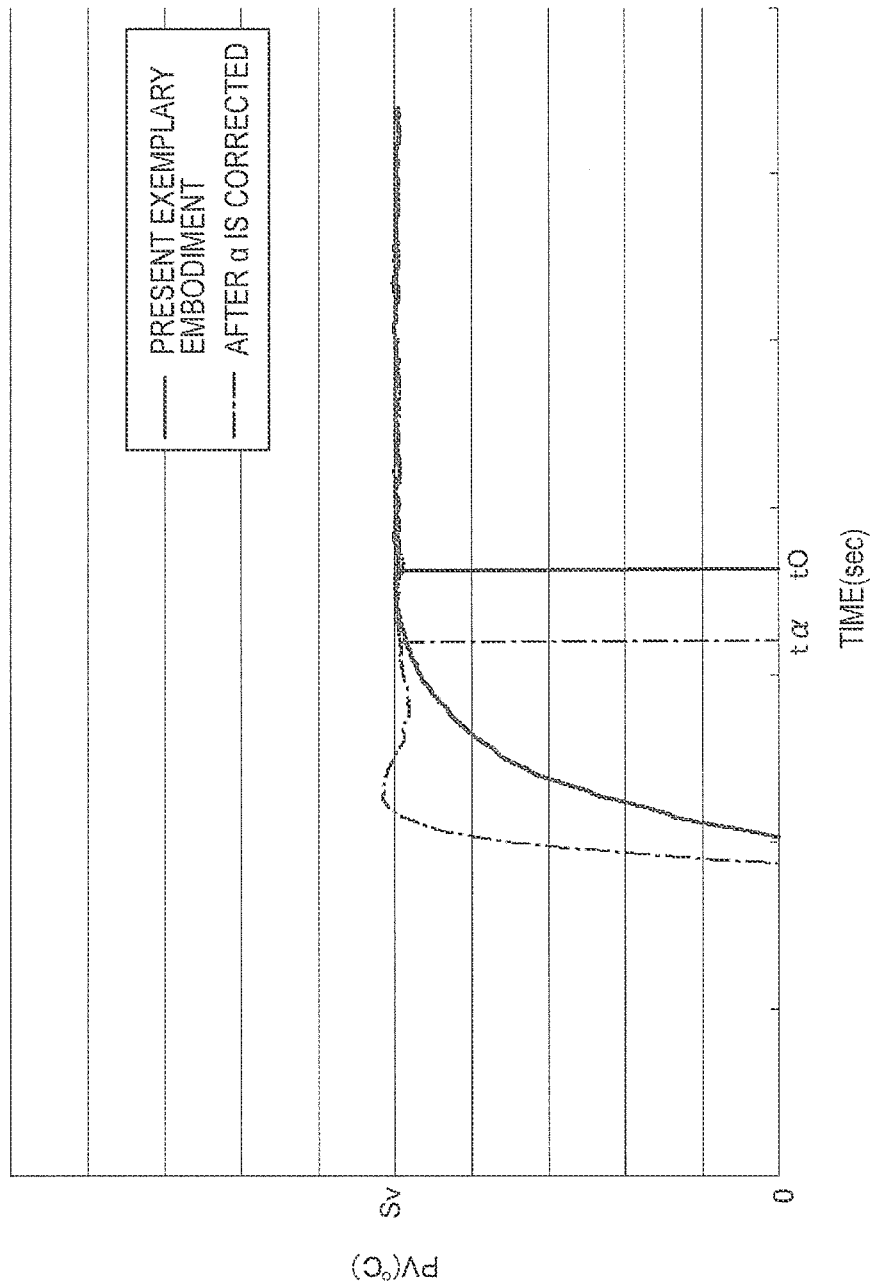

FIG. 14 is a graph illustrating temperature transitions of the fluid in the treatment bath until the temperature of the fluid is settled at the temperature setpoint in the case of the heat loss coefficient α being corrected and in the case of the heat loss coefficient α being uncorrected, according to the third exemplary embodiment.

Figure 15:
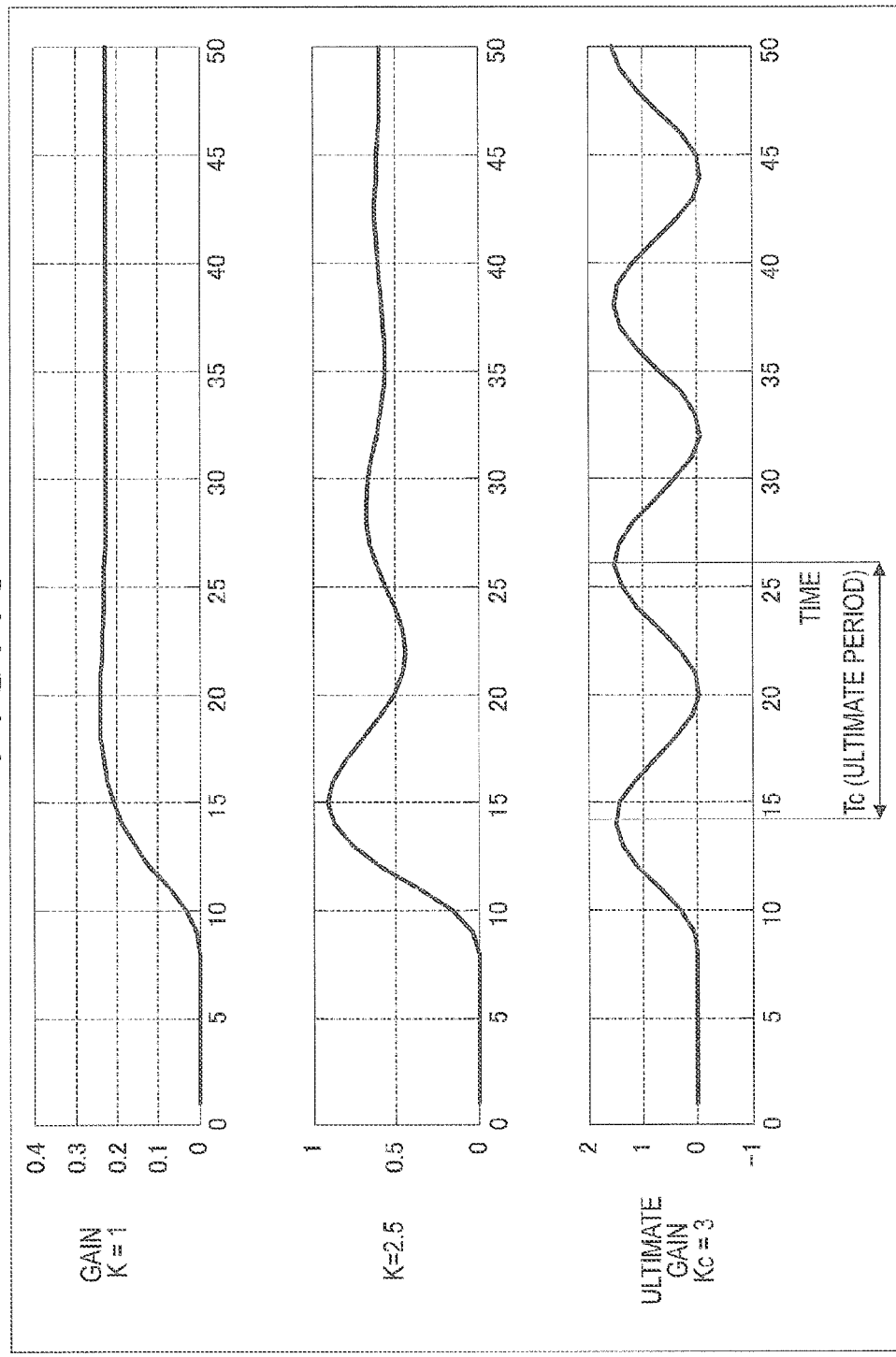

FIG. 15 is a graph illustrating how to calculate the PID constants by an ultimate sensitivity method according to a modification of the first exemplary embodiment of the invention.

Figure 16:
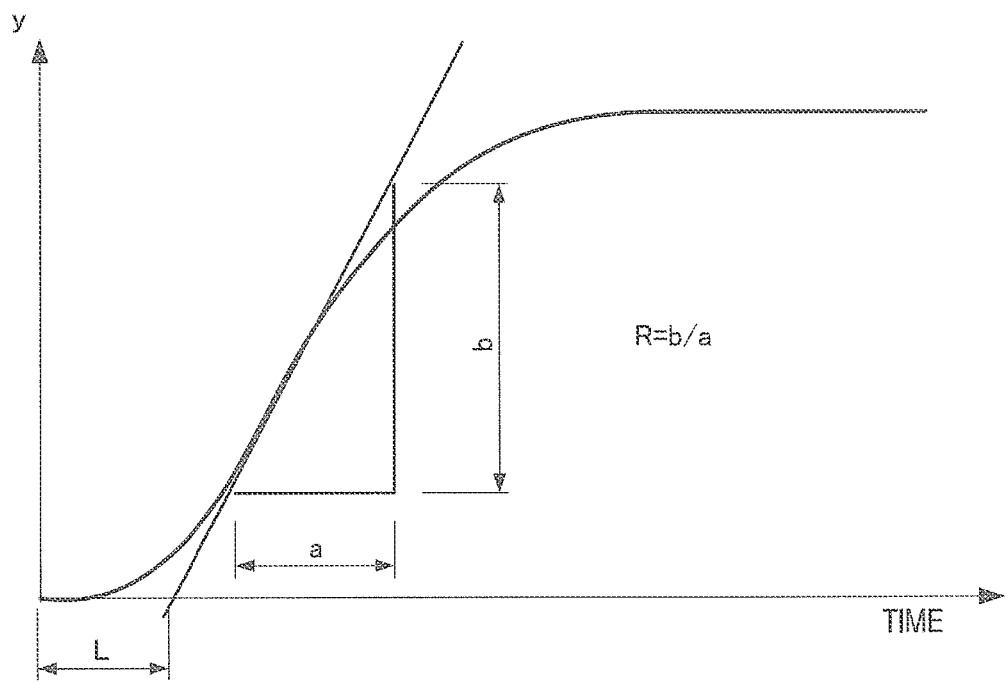

FIG. 16 is a graph illustrating how to calculate the PID constants by a step-response method according to another modification of the first exemplary embodiment of the invention.

DESCRIPTION OF EMBODIMENT(S)

Exemplary embodiment(s) of the invention will be described below with reference to the attached drawings.

First Exemplary Embodiment

Figure 1:
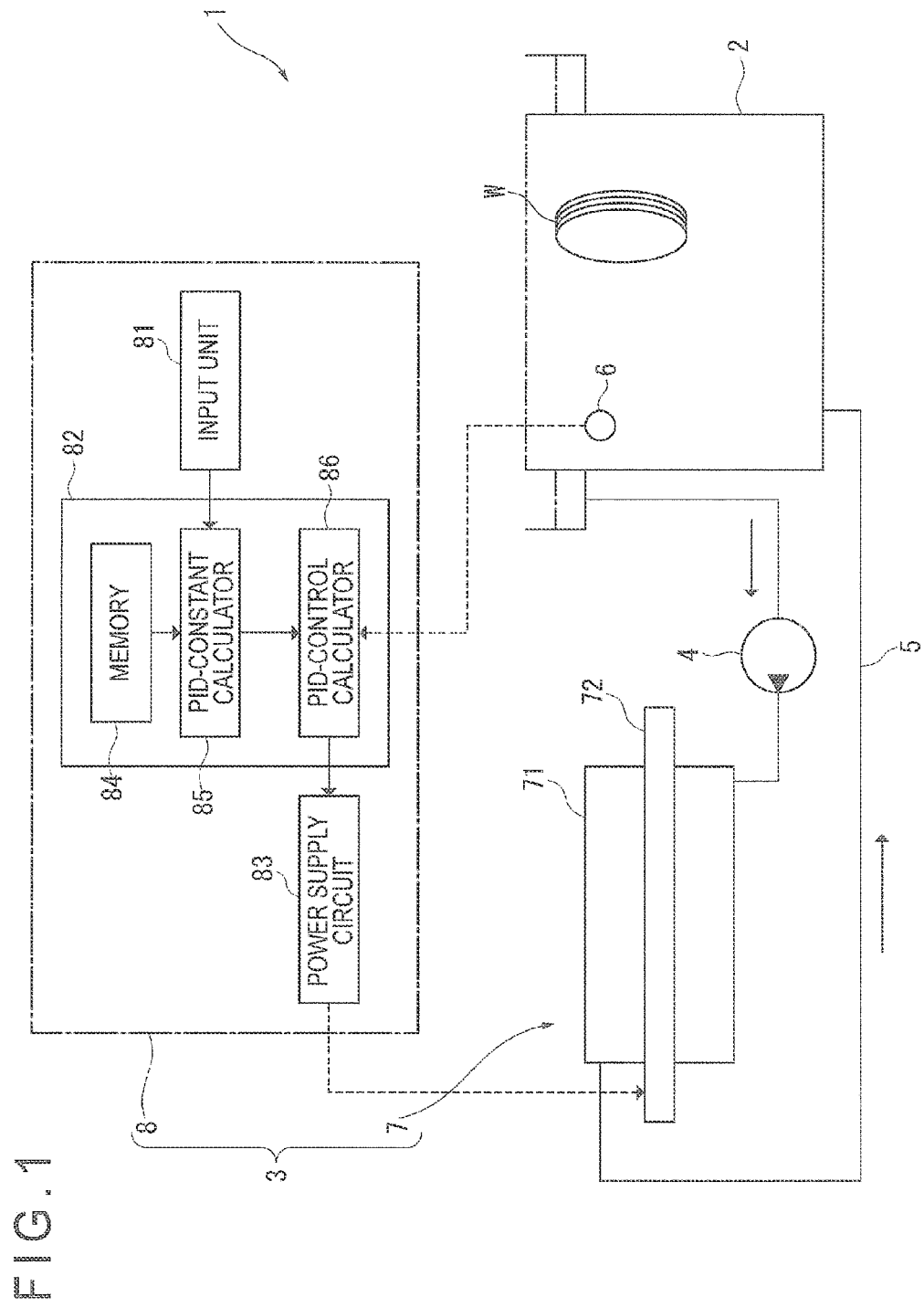

FIG. 1 illustrates treatment equipment 1, which is an example of a semiconductor manufacturing apparatus according to a first exemplary embodiment of the invention. The treatment equipment 1 includes: a treatment bath 2 in which a semiconductor wafer W is to be immersed; a temperature adjustment system 3 that supplies a temperature-adjusted chemical solution to the treatment bath 2; and a pump 4 and a duct 5 that connect the treatment bath 2 and the temperature adjustment system 3.

The treatment equipment 1 is closed-loop treatment equipment. Specifically, the chemical solution (fluid) temperature-adjusted by the temperature adjustment system 3 is supplied to the treatment bath 2 from therebeneath, and overflowing chemical solution is recycled and supplied to the treatment bath 2 after again temperature-adjusted by the temperature adjustment system 3.

The treatment bath 2 contains the chemical solution (e.g., water, sulfuric acid, etc.) and the semiconductor wafer W is immersed in the chemical solution in the treatment bath 2 to be cleaned, etched or the like.

A temperature sensor 6 is provided in the treatment bath 2 to detect the temperature of the chemical solution and a detected value is outputted in the form of an electric signal to the temperature adjustment system 3.

The temperature adjustment system 3 includes: a heat exchanger 7 that adjusts the temperature of the chemical solution; and a power supply unit 8 that supplies electric power to the heat exchanger 7.

The heat exchanger 7 includes: a quartz heat exchanger pipe 71; and a temperature adjuster 72 that penetrates through the heat exchanger pipe 71 substantially at the center thereof.

The heat exchanger pipe 71 has opposite end surfaces each closed with a quartz plate, and a lower portion of one of the ends is provided with a hole (not shown) for introducing the chemical solution whereas an upper portion of other end is provided with a hole (not shown) for discharging the chemical solution with an adjusted temperature, the holes being connected to the duct 5. It should be noted that the heat exchanger pipe 71 has an outer circumference provided with a heat insulation material (not shown) so that heat radiated from the temperature adjuster 72 can be efficiently transmitted to the chemical solution in the heat exchanger pipe 71.

The temperature adjuster 72, which penetrates through the heat exchanger pipe 71 substantially at the center thereof, has an end provided with an electrode (not shown). The electrode is connected to an electric wiring from the power supply unit 8 so that the electrode is supplied with electric power from the power supply unit 8 to be heated.

In the first exemplary embodiment, a halogen lamp is used as the temperature adjuster 72, the halogen lamp including a closed quartz sheath pipe in which halogen gas is contained and a filament is inserted to be substantially centered. Alternatively, the temperature adjuster 72 may be a sheath heater including a sheath pipe in which a Nichrome wire is inserted in the form of a coil or a sheath pipe in which a Peltier element is inserted. With the Peltier element, the temperature adjuster 72 can heat or cool the chemical solution by changing the polarity of electric current from the power supply unit 8, so that the temperature of the chemical solution can be promptly adjusted with high accuracy.

The power supply unit 8, which supplies electric power to the temperature adjuster 72 of the heat exchanger 7, includes an input unit 81, a controller 82 and a power supply circuit 83.

The input unit 81, which is a touch panel, an operation switch or the like, is used by an operator not only to input the setpoint of the temperature of the chemical solution, the value of a flow rate in the pump 4, and the like, but also to set various conditions of the treatment equipment 1 (described later) and to input the physical properties of the chemical solution and the like.

The controller 82 performs a PID control on the temperature adjuster 72 of the heat exchanger 7 and includes a memory 84, a PID-constant calculator 85 and a PID-control calculator 86.

The memory 84 stores set values of various variables for the temperature adjustment system 3.

Based on the set values of the various variables stored in the memory 84 and the physical properties of the chemical solution and the like inputted using the input unit 81, the PID-constant calculator 85 generates a model of the overall treatment equipment 1 to calculate the PID constants.

Specifically, the model of the overall treatment equipment 1 is generated based on various variables shown in Table 1. In Table 1, "At the Start of Operation" in the column of "When Inputted" means that a value is directly inputted using the input unit 81 at the start of the operation of the treatment equipment 1. "At the Boot-up of Treatment Equipment" means that a value is inputted using the input unit 81 at the setting of the treatment equipment 1 and stored in the memory 84. "During Designing Temperature Adjustment System" means that a value is stored in the memory 84 in advance during designing the temperature adjustment system 3.

TABLE 1

| Parameter | Unit | Name | When Inputted |
|---|---|---|---|
| q | m³/sec | Circulation Flow Rate | At the Start of Operation |
| Vb | m³ | In-bath Solution Volume | |
| ρ | kg/m³ | Density of Chemical Solution | |
| Cp | J/(kg · K) | Specific Heat of Chemical Solution | |
| Sv | K | Temperature Setpoint | |
| Tr | K | Ambient Temperature | |
| α | 1/sec | Heat Loss Coefficient | At the Boot-up of Treatment Equipment |
| Tsen | sec | Sensor Time Constant | |
| Vp | m³ | Duct Capacity | |
| P | kW | Lamp Output | During Designing Temperature Adjustment System |
| V1 | m³ | Heat Exchanger Capacity | |
| γ | None | Coefficient | |

It should be noted that the heat loss coefficient α, which may be determined by experiment or simulation during designing the treatment equipment 1, is represented by a function of a difference between the temperature setpoint Sv and the ambient temperature Tr. Specifically, the heat loss coefficient α may be calculated by the following formula (3) when Pss denotes a stationary temperature output, Tss denotes a bath temperature in a stationary phase and Tr denotes the ambient temperature.

Numerical Formula 4

$$\alpha = \frac{Pss}{Vb\rho Cp(Tss - Tr)} \quad (3)$$

A transfer function of the overall treatment equipment 1, which is denoted by $G_1(s)$, may be represented as a transfer function of a dead time+a third order lag system such as the following formula (4). The PID-constant calculator 85 substitutes the set values of the variables shown in Table 1 into the transfer function $G_1(s)$ such as the following formula (4) to construct the model of the overall treatment equipment 1.

Numerical Formula 5

$$G_1(s) = \frac{(V1s+q)}{(\gamma V1s+q)} \cdot \frac{P(q-\alpha Vb)/\rho Cp}{(V1Vbs^2+(V1+Vb)qs+\alpha Vbq)} \cdot \frac{1}{(Tsens+1)} \cdot e^{-Ls} \quad (4)$$

$$(L = Vp/q)$$

It should be noted that γ is a coefficient (γ≥1) changeable with the type of the temperature adjuster 72.

The formula (4) can be derived from conditions of a heat balance in the heat exchanger 7.

When Ta(t)° C. denotes a temperature of the chemical solution entering a part of the duct 5 on an inlet of the heat exchanger 7 at a time t and Tb(t)° C. denotes a temperature of the chemical solution discharged through a part of the duct 5 on an outlet of the heat exchanger 7 at the time t, the conditions of the heat balance in the heat exchanger 7 are represented by the following formula (5).

Numerical Formula 6

$$V1\rho Cp\frac{dTb(t)}{dt} = P(t) - q\rho Cp(Tb(t) - Ta(t)) \quad (5)$$

P(t): Lamp output at time t

Conditions of a heat balance in the treatment bath 2 are represented by the following formula (6).

Numerical Formula 7

$$Vb\rho Cp\frac{dTa(t)}{dt} = q\rho Cp(Tb(t) - Ta(t)) - Kr(Tb(t) - Tr(t)) \quad (6)$$

$$Kr = \alpha \times Vb\rho Cp$$

Tr(t): Ambient temperature at time t

Transfer functions obtained by the formulae (5) and (6) are integrated and the dynamic characteristics of the temperature adjuster 72 (a lamp output, in this exemplary embodiment) are inserted thereinto in the form of a transfer function of a first order lag system with a time constant that is γ times as large as that of the temperature transfer characteristics. Additionally, a transfer function of the temperature sensor 6 for measuring the temperature of the treatment bath 2 (the transfer function should be a first order lag system in which a time constant is denoted by Tsen (sec)) and a dead time L (sec) of circulation are further added, thereby obtaining the formula (4).

In order to calculate the PID constants, the PID-constant calculator 85 performs a simulation on the model of the formula (4) using a limit cycle method proposed by Astrom in 1984 and the Ziegler & Nichols tuning rules based on an ultimate sensitivity method.

Figure 2A:
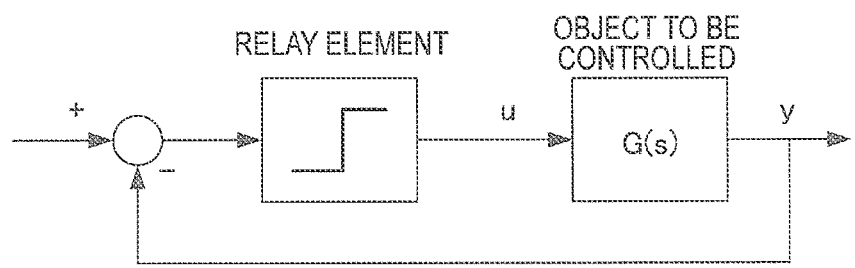
FIG. 2A is a graph illustrating how to calculate PID constants by a limit cycle method according to the first exemplary embodiment.
Figure 2B:
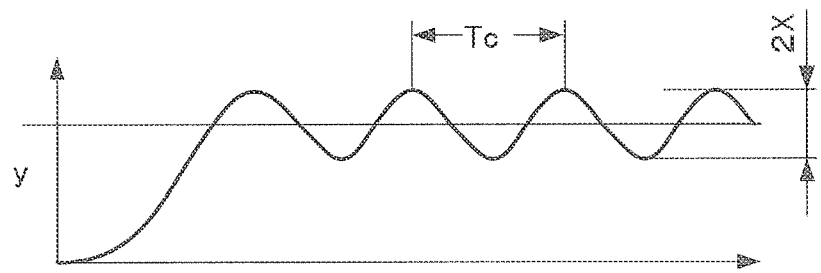
FIG. 2B is a graph illustrating how to calculate the PID constants by the limit cycle method according to the first exemplary embodiment.
Figure 2C:
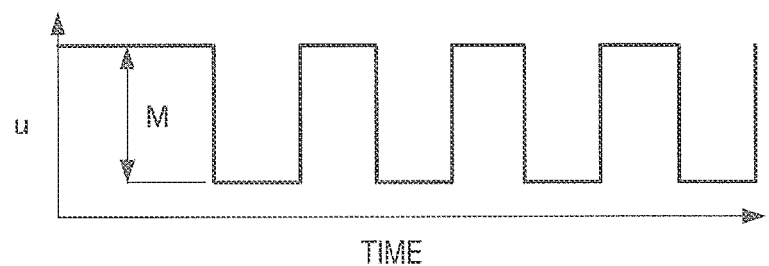
FIG. 2C is a graph illustrating how to calculate the PID constants by the limit cycle method according to the first exemplary embodiment.

Specifically, according to the limit cycle method, a relay element is disposed upstream of an object to be controlled as shown in FIG. 2A, an ON/OFF signal or the like as shown in FIG. 2C is inputted, and an output as shown in FIG. 2B is obtained to calculate an ultimate gain Kc and an ultimate period Tc.

While calculating the ultimate period Tc with reference to FIG. 2B, the PID-constant calculator 85 calculates the ultimate gain Kc from an input amplitude M and an output amplitude X as shown in FIG. 2C using the following formula (7).

Numerical Formula 8

$$Kc = \frac{4M}{\pi X} \quad (7)$$

Based on the ultimate period Tc obtained with reference to FIG. 2B and the ultimate gain Kc calculated using the formula (7), the PID-constant calculator 85 calculates the PID constants as follows.

Proportional gain: Kp=0.6Kc
Integral time: Ti=0.5Tc
Derivative time: Td=0.125Td

As shown in FIG. 3, the PID-control calculator 86 calculates a manipulated variable from a deviation between a temperature setpoint set by an operator and a current temperature variable detected by the temperature sensor 6. Specifically, the deviation is multiplied by a constant in a proportional term, the deviation is added in an integral term, a rate of change is calculated in a derivative term, and these results are summed to obtain the manipulated variable.

In the PID control, weighting needs to be performed to determine the magnitude of each of the proportional term, the integral term and the derivative term. The weighting is performed based on the proportional gain Kp, the integral time Ti and the derivative time Td to calculate the manipulated variable.

When the PID-control calculator 86 outputs the calculated manipulated variable to the power supply circuit 83, the power supply circuit 83 converts the control variable into analog data and outputs it in the form of an electric signal to the temperature adjuster 72.

Next, effects of the first exemplary embodiment will be described with reference to a flow chart shown in FIG. 4.

First, when an operator switches on the controller 82 (step S1), the PID-constant calculator 85 reads from Table 1 stored in the memory 84 fixed parameters of "At the Boot-up of Treatment Equipment" and "During Designing Temperature Adjustment System" (step S2).

Next, when the operator sets the parameters of "At the Start of Operation" in Table 1 using the input unit 81, the PID-constant calculator 85 reads these set parameters (step S3).

The PID-constant calculator 85 substitutes the read parameters into the transfer function $G_1(s)$ of the formula (3) to construct the model of the overall treatment equipment 1 (step S4).

The PID-constant calculator 85 starts a simulation on the model of the overall treatment equipment 1 using the limit cycle method (step S5), and calculates the ultimate gain Kc and the ultimate period Tc (step S6).

The PID-constant calculator 85 calculates the proportional gain Kp, the integral time Ti and the derivative time Td from the ultimate gain Kc and the ultimate period Tc (step S7), and sends them to the PID-control calculator 86 (step S8).

The PID-control calculator 86 performs the weighting with the received proportional gain Kp, the integral time Ti and the derivative time Td, and starts the PID control calculation for the temperature adjuster 72 (step S9).

In the first exemplary embodiment, prior to the start of the operation of the treatment equipment 1, the PID-constant calculator 85 calculates the PID constants by simulation on the model of the overall treatment equipment 1 based on the transfer function $G_1(s)$, so that the operation of the treatment equipment 1 can be promptly started with the calculated PID constants.

Second Exemplary Embodiment

Next, a second exemplary embodiment of the invention will be described. It should be noted that, in the following description, components, portions and the like identical to those described above are attached with the same reference signs and the explanation thereof is omitted.

The treatment equipment 1 according to the first exemplary embodiment is closed-loop treatment equipment to which the invention is applied.

In contrast, the second exemplary embodiment is different from the first exemplary embodiment in that the invention is applied to open-loop treatment equipment. Specifically, as shown in FIG. 5, treatment equipment 10 according to the second exemplary embodiment includes: the temperature adjustment system 3 that adjusts the temperature of a chemical solution; and a single-wafer spinning cleaner 11 that is to be supplied with the chemical solution with the adjusted temperature, the chemical solution not being returned to the temperature adjustment system 3 after being used for a treatment.

In the first exemplary embodiment, the PID-constant calculator 85 uses the Ziegler & Nichols tuning rules to calculate the PID constants.

In contrast, the second exemplary embodiment is different from the first exemplary embodiment in that a PID-constant calculator 15 uses the IMC (Internal Model Control)-PID tuning rules to calculate the PID constants.

The second exemplary embodiment will be described below in detail.

As shown in FIG. 5, the single-wafer spinning cleaner 11 includes: a rotation shaft 12; and a platform 13 provided on the rotation shaft 12 and on which a semiconductor wafer W is to be set.

In cleaning, the rotation shaft 12 is rotated to rotate the semiconductor wafer W, to which cleaning water or a chemical solution such as an etching solution is supplied from above the rotation shaft 12 through a nozzle 14. During the rotation of the semiconductor wafer W, the chemical solution on the semiconductor wafer W centrifugally spreads to the periphery of the semiconductor wafer W to treat the entire surface of the semiconductor wafer W, and is then discharged to the outside.

Based on the set values of the variables stored in the memory 84 and the physical properties of the chemical solution and the like inputted using the input unit 81, the PID-constant calculator 15 of the power supply unit 8 generates a model of the overall treatment equipment to calculate the PID constants.

Specifically, the model is generated based on various variables shown in Table 2.

TABLE 2

| Parameter | Unit | Name | When Inputted |
|---|---|---|---|
| q | m³/sec | Circulation Flow Rate | At the Start of Operation |
| ρ | kg/m³ | Density of Chemical Solution | |
| Cp | J/(kg · K) | Specific Heat of Chemical Solution | |
| P | kW | Lamp Output | At the Boot-up of Treatment Equipment or During Designing Temperature Adjustment System |
| V1 | m³ | Heat Exchanger Capacity | |
| Vp | m³ | Duct Capacity | |
| γ | None | Coefficient | During Designing Temperature Adjustment System |

A transfer function of the overall treatment equipment 10, which is denoted by $G_2(s)$, may be represented as a transfer function of a dead time+a second order lag system as shown in the following formula (8). The PID-constant calculator 15 substitutes the set values of the variables shown in Table 2 into the transfer function $G_2(s)$ such as the following formula (8) to construct the model of the overall treatment equipment 10.

Numerical Formula 9

$$G_2(s) = \frac{P}{(\gamma V1 \rho Cps + q\rho Cp)} \cdot \frac{1}{(Tsen\ s + 1)} \cdot e^{-Ls} \quad (8)$$

$$(L = Vp/q)$$

It should be noted that γ is a coefficient (γ≥1) changeable with the type of the temperature adjuster 72.

In the second exemplary embodiment, since the chemical solution is not circulated, a transfer function derived from the formula (5) of the first exemplary embodiment (i.e., the conditions for the heat balance in the heat exchanger 7) is represented by the following formula (9).

Numerical Formula 10

$$Tb(s) = \frac{1}{V1\rho Cps + q\rho Cp}(P(s) + q\rho CpTa(s)) \quad (9)$$

When Ta(s)(° C.) at the part of the duct 5 on the inlet of the heat exchanger 7 is a balance point (i.e., zero degrees C.), the following formula (10) is derived.

Numerical Formula 11

$$Tb(s) = \frac{1}{V1\rho Cps + q\rho Cp} P(s) \quad (10)$$

In the formula (10), P(s) (W) denotes an input variable. Accordingly, when an input variable u(s)=0 to 1 from the controller 82 is assigned to 0 to P (Pmax) and, further, the dynamic characteristics of the temperature adjuster 72 are set γ times as large as a time constant obtained in the formula (10), the following formula (11) is obtained.

Numerical Formula 12

$$Tb(s) = \frac{P}{\gamma V1\rho Cps + q\rho Cp} \cdot u(s) \quad (11)$$

When the temperature sensor 6 with the time constant Tsen is connected to the part of the duct 5 on the outlet and, further, the dead time L=Vp/q from the outlet of the heat exchanger to the temperature sensor is considered, the formula (11) is transformed into the following formula (12) and the transfer function $G_2(s)$ of the formula (8) is derived.

Numerical Formula 13

$$Tb(s) = \frac{P}{\gamma V1\rho Cps + q\rho Cp} \cdot \frac{1}{Tsen + 1} \cdot e^{-Ls} \cdot u(s) \quad (12)$$

When the denominator and molecule of the thus-derived formula (8) is multiplied by 1/qρCp, the formula (8) is transformed into the following formula (13).

Numerical Formula 14

$$G_2(s) = \frac{P}{(\gamma V1/q \cdot s + 1)} \cdot \frac{1/q\rho Cp}{(Tsen\ s + 1)} e^{-Ls} \quad (13)$$

The formula (13) corresponds to, for instance, a model M(s) represented by the following formula (14) according to the IMC-PID tuning rules.

Numerical Formula 15

$$M(s) = \frac{K}{(T_1 s + 1)(T_2 s + 1)} \cdot e^{-Ls} \quad (14)$$

Specifically, $T_1$, $T_2$ and K in the formula (14) are calculated as follows.

$$T1 = \gamma V1/q$$

$$T_2 = Tsen$$

$$K = P/q\rho Cp$$

When the IMC-PID tuning rules are applied, the PID constants are calculated by the following formulae (15). It should be noted that λ denotes the time constant of a tuning filter according to the IMC-PID tuning rules, which is approximately the half of $T_1$.

Numerical Formula 16

$$Kp = \frac{T_1 + T_2}{K \times (\lambda + L)} \quad (15)$$

$$Ti = T_1 + T_2$$

$$Td = \frac{T_1 \times T_2}{T_1 + T_2}$$

Next, effects of the second exemplary embodiment will be described with reference to a flow chart shown in FIG. 6.

First, when the controller is switched on in the same manner as in the first exemplary embodiment (step S1), the PID-constant calculator 15 reads from Table 2 stored in the memory 84 fixed parameters other than parameters of "At the Start of Operation" (step S2), and then reads the parameters of "At the Start of Operation" as inputted by an operator (step S3).

The PID-constant calculator 15 substitutes the read parameters into the transfer function $G_2(s)$ of the formula (6) to construct a continuous-time system transfer function of the overall treatment equipment 10 (step S11).

The IMC-PID tuning rules are applied to the gain and the time constant of the filter to calculate the proportional gain Kp, the time integration Ti and the derivative time Td provided by the formula (9) (step S12).

The PID-constant calculator 15 sends the calculated PID constants (Kp, Ti and Td) to the PID-control calculator 86 (step S8) and the PID-control calculator 86 starts the temperature control of the heat exchanger 7 (step S9).

The second exemplary embodiment can provide effects similar to those of the first exemplary embodiment.

Third Exemplary Embodiment

Next, a third exemplary embodiment of the invention will be described. It should be noted that, in the following description, arrangements and processes identical to those described in the first exemplary embodiment are attached with the same reference signs and the explanation thereof is omitted.

In the first exemplary embodiment, the controller 82 includes the PID-constant calculator 85 and the PID-control calculator 86.

In contrast, the third exemplary embodiment is different from the first exemplary embodiment in that a controller 90 of the third exemplary embodiment includes an input/output data storage 91, a transfer function model generator 92, a transfer function model selector 93 and a transfer function model corrector 94 in addition to the PID-constant calculator 85 and the PID-control calculator 86, as shown in FIG. 7.

The input/output data storage 91 stores temperature data of the inside of the treatment bath 2 measured by the temperature sensor 6 in the treatment bath 2 and the manipulated variable calculated from the temperature data by the PID-control calculator 86.

The transfer function model generator 92 varies the in-bath solution volume (fluid volume) Vb ($m^3$) in the treatment bath 2 of the formula (16) to n levels [Vb1, Vb2, . . . Vbn] to create n continuous-time system transfer function models [$G_1(s)$, $G_2(s)$, . . . $G_n(s)$], the formula (16) having been used to calculate the PID constants (proportional gain: Kp, integral time: Ti, derivative time: Td). The transfer function model generator 92 then generates a set of discrete-time system transfer function models $G_1(z)$ to $G_n(z)$ respectively transformed from the continuous-time system transfer function models [$G_1(s)$, $G_2(s)$, . . . $G_n(s)$].

Numerical Formula 17

$$G_1(s) = \frac{(V1s+q)}{(\gamma V1s+q)} \frac{P(q-\alpha Vb)/\rho Cp}{(V1Vbs^2 + (V1+Vb)qs + \alpha Vbq)} \cdot \frac{1}{(Tsen\, s+1)} \cdot e^{-Ls} \quad (16)$$

$$(L = Vp/q)$$

The transfer function model selector 93 loads input/output data of the actual equipment, which is obtained after the start of an actual operation, into the input/output data storage 91, the input/output data including input manipulated variables ur(0) to ur(N) and the temperatures yr(0) to yr(N) of the fluid in the treatment bath 2 measured by the temperature sensor 6.

The transfer function model selector 93 then adds the input manipulated variables ur(0) to ur(N) stored in the input/output data storage 91 to the n transfer function models $G_1(z)$ to $G_n(z)$ generated by the transfer function model generator 92, and calculates a set of n output data matrices y1(z) to yn(z) using the following formula (17). Specifically, as shown in FIG. 8, the set of n output data matrices are obtained in the form of a graph showing a relation between a heating time and the temperature of the fluid in the treatment bath 2 (i.e., an output).

Numerical Formula 18

$$yi(z) = Gi(z) \cdot ui(z) \quad (17)$$
$$i = 1 \cdots n$$
$$z = 0 \cdots N$$
$$\therefore$$
$$y1(0), y1(1), \cdots, y1(N)$$
$$y2(0), y2(1), \cdots, y2(N)$$
$$\cdots$$
$$yn(0), yn(1), \cdots, yn(N)$$

As shown in FIG. 9, the transfer function model selector 93 obtains the following formulae (18) representing a deviation d(i) (i=1 . . . n) in the form of root mean square between the output data of the actual equipment yr(0) to yr(N) and each of the n output data matrices y1(0) to y1(N), . . . yn(0) to yn(N) obtained using the formula (17).

Numerical Formula 19

$$d(1) = \sqrt{(yr(0)-y1(0))^2 + \ldots + (yr(N)-y1(N))^2}$$
$$d(2) = \sqrt{(yr(0)-y2(0))^2 + \ldots + (yr(N)-y2(N))^2}$$
$$d(n) = \sqrt{(yr(0)-yn(0))^2 + \ldots + (yr(N)-yn(N))^2} \quad (18)$$

The transfer function model selector 93 selects one of the transfer function models with the smallest one of the obtained deviations d(1) to d(n), and outputs to the transfer function model corrector 94 the fluid volume Vb in the treatment bath 2 of the selected transfer function model. It should be noted that a variety of deviation-calculating methods for statistics are usable to calculate the deviation in place of using the formulae (18) as in the third exemplary embodiment.

The transfer function model corrector 94 overwrites the in-bath solution volume (fluid volume) Vb in Table 1 stored in the memory 84 (explained in the first exemplary embodiment) with the fluid volume Vb in the treatment bath 2 of the selected transfer function model outputted from the transfer function model selector 93.

Further, the transfer function model corrector 94 also overwrites the heat loss coefficient α in Table 1 and the dead time L of the formula (1) respectively with a corrected heat loss coefficient α and the dead time L measured by the temperature sensor 6, as described later in detail.

Next, effects of the third exemplary embodiment will be described with reference to flow charts shown in FIGS. 10 and 11.

The steps S1 to S9 are identical to those of the first exemplary embodiment, and thus the explanation thereof will be omitted.

When the PID-control calculator 86 starts the control of the temperature adjuster 72 (step S9), the input/output data storage 91 receives electric signals from the temperature sensor 6 every predetermined time and measures the dead time L (see FIG. 10). Regarding a measurement method, for instance, a time elapsed since the start of heating until an increase in the temperature in the treatment bath 2 at a certain minute level is detected as the dead time L. When the dead time L is measured, the transfer function model corrector 94 overwrites the dead time L of the formula (16) stored in the memory 84 with the dead time L measured in the actual equipment (step S20).

The transfer function model generator 92 changes the fluid volume Vb in the treatment bath 2 using the transfer function of the formula (16), which has been used by the PID-constant calculator 85, to generate the set of the plurality of transfer function models G1(z) to $G_n(z)$ (step S21).

The transfer function model selector 93 loads input/output data such as the input manipulated variables ur(0) to ur(N) and the temperatures yr(0) ... yr(N) of the fluid in the treatment bath 2 measured by the temperature sensor 6 into the input/output data storage 91 at a predetermined sampling period Δt (step S22), and repeats the loading process for a predetermined number of times, for instance, until n pieces of data are loaded (step S23).

The transfer function model selector 93 calculates, using the formula (17), the set of output data matrices [y1(0) to y1(N)], ... [yn(0) to yn(N)] corresponding to the predetermined input variables ur(0) to ur(N) from the plurality of transfer function models G1(z) to Gn(z) generated by the transfer function model generator 92.

Subsequently, the transfer function model selector 93 obtains the formulae (18), in which the deviation d(1) between the temperatures yr(0) to yr(N) of the fluid in the treatment bath 2 of the actual equipment and the output data matrices y1(0) to y1(N) to the deviation d(n) between the temperatures yr(0) to yr(N) of the fluid and the outputs yn(0) to yn(N) are represented, for instance, in the form of root mean square.

The transfer function model selector 93 selects one of the transfer function models with the smallest one of the obtained deviations d(1) to d(n) (step S24), and outputs to the transfer function model corrector 94 the fluid volume Vb in the treatment bath 2 set in the selected transfer function model.

The transfer function model corrector 94 overwrites the in-bath solution volume (fluid volume) Vb in Table 1 stored in the memory 84 with the fluid volume Vb in the treatment bath 2 outputted from the transfer function model selector 93 (step S25).

Based on the overwritten transfer function model, the PID-constant calculator 85 again performs a simulation using the limit cycle method (step S26), and calculates the ultimate gain Kc and the ultimate period Tc (step S27).

The PID-constant calculator 85 calculates the proportional gain Kp, the time integration Ti and the derivative time Td from the calculated ultimate gain Kc and the ultimate period Tc, and sends them to the PID-control calculator 86 (step S29).

Based on the corrected proportional gain Kp, time integration Ti and derivative time Td, the PID-control calculator 86 starts the control of the temperature adjuster 72 (step S30).

Based on the temperature data of the fluid in the treatment bath 2 outputted from the temperature sensor 6, the PID-control calculator 86 monitors whether or not the temperature of the fluid in the treatment bath 2 is settled at a temperature setpoint (step S31), and outputs, upon determining that the temperature of the fluid is adjusted to the temperature setpoint, an electric signal indicating that the temperature of the fluid is adjusted to the temperature setpoint to the transfer function model corrector 94.

Upon the reception of the electric signal indicating that the temperature of the fluid is settled at the temperature setpoint, the transfer function model corrector 94 acquires a relevant input manipulated variable MVss (%) (step S32).

For instance, when the control is stopped after the temperature of the fluid in the treatment bath 2 is settled at the temperature setpoint, the temperature of the fluid in the treatment bath 2 decreases due to heat radiation from the treatment bath 2. Accordingly, as shown in FIG. 12, the PID-control calculator 86 compensates a decrease in heat quantity due to the heat radiation with such a post-settlement input manipulated variable MVss to maintain the temperature of the fluid in the treatment bath 2.

Based on the acquired post-settlement input manipulated variable MVss, the lamp output P (kW), the temperature setpoint (desired temperature) Sv (K) and the ambient temperature Tr (K), the transfer function model corrector 94 calculates another heat loss coefficient α using the following formula (19) (step S33), and overwrites the heat loss coefficient α stored in the memory 84 (step S34). It should be noted that the overwritten heat loss coefficient α is used as a heat loss coefficient of the formula (16) for the next operation.

Numerical Formula 20

$$\alpha = \frac{P \times MVss \times 0.01}{Vb\rho Cp(Sv - Tr)} \quad (19)$$

In the third exemplary embodiment, as shown in the graph of FIG. 13, the temperature of the fluid in the treatment bath 2 can be settled at the temperature setpoint in a further shorter time with the assistance of the transfer function model corrector 94, which results in reducing a time required to initially boot up the treatment equipment 1, a time required to change the procedure during operation, and a time required to change the recipe of the fluid in the treatment bath 2.

Further, the transfer function model corrector 94 corrects the heat loss coefficient α based on the input manipulated variable MVss applied after the temperature of the fluid in the treatment bath 2 is settled at the temperature setpoint, so that the temperature of the fluid can be adjusted to the temperature setpoint in a further shorter time as shown in FIG. 14, which results in further reducing a time required to initially boot up the equipment for the next operation. Moreover, a heat loss coefficient α may be changed depending on an external disturbing factor (e.g., a seasonal variation) to further improve the accuracy of the PID control.

Modification of Exemplary Embodiment(s)

Incidentally, it should be understood that the scope of the invention is not limited to the above-described exemplary embodiments, but includes modifications and improvements as long as the modifications and improvements are compatible with the invention.

For instance, the ultimate gain Kc and the ultimate period Tc may be calculated in a different manner without using the limit cycle method as in the first exemplary embodiment. For instance, the process proportional gain Kp may be gradually increased to a value at which a response waveform starts diverging, the value being defined as the ultimate gain Kc. In this case, the period of the diverging response waveform is defined as the ultimate period Tc.

Alternatively, a step-response method may be employed. Step signals are thus inputted to the process to obtain the PID constants based on the characteristics of a response waveform, as shown in FIG. 16. In this method, the PID constants can be obtained by drawing a tangent passing through an inflexion point on a response curve, obtaining the angle of the tangent, and obtaining the dead time L from an intersecting point with a time axis. In this case, the PID constants may be calculated as follows.

$Kp=1.2/RL$ $Ti=2L$ $Td=0.5L$

Although the Ziegler & Nichols tuning rules or the IMC-PID tuning rules are used to calculate the PID constants in the above exemplary embodiments, any other tuning rules such as CHR (Chien, Hrones, Reswick) tuning rules may be used to calculate the PID constants.

Although the controller 82 of the temperature adjustment system 3 calculates the PID constants in the above exemplary embodiments, the PID constants (calculation results) may be calculated by the PID-constant calculator 15 or 85 according to the invention installed as a program in a terminal such as a personal computer or a smart phone and the resultant PID constants may be inputted to the controller 82 to perform the temperature control.

Although the fixed parameters are stored in the memory 84 in advance in the above exemplary embodiments, all the parameters may be inputted using the input unit 81 at the start of each operation. The value of any variable (e.g., a flow rate) may be measured by a sensor, if possible, and inputted as the value of the parameter.

The invention claimed is:

1. A temperature adjustment system for a semiconductor manufacturing apparatus, the temperature adjustment system being configured to adjust a temperature of a fluid used in the semiconductor manufacturing apparatus, the semiconductor manufacturing apparatus being a closed-loop semiconductor manufacturing apparatus comprising a treatment bath for treating a semiconductor, the treatment bath being supplied with the fluid with the adjusted temperature, the fluid being recycled from the treatment bath after being used for treating the semiconductor and again subjected to a temperature adjustment, the temperature adjustment system comprising:
  a heat exchanger comprising therein a temperature adjuster for heating and cooling the fluid, the heat exchanger being configured to perform heat exchange between the fluid therein and the temperature adjuster;
  a temperature sensor configured to measure the temperature of the fluid;
  a proportional integral derivative (PID) constant calculator configured to calculate PID constants for PID control based on: a circulation flow rate of the fluid; a density and a specific heat of the fluid; a capacity of the heat exchanger; a heat loss coefficient in a form of a function of a deviation between a temperature setpoint of the fluid and an ambient temperature; a capacity of a duct of the semiconductor manufacturing apparatus through which the fluid flows; a fluid volume in the treatment bath; and a time constant of the temperature sensor;
  a PID-control calculator configured to perform the PID control on the temperature adjuster with the PID constants calculated by the PID-constant calculator;
  a transfer function model generator configured to generate a plurality of transfer function models from an original transfer function model used by the PID-constant calculator to calculate the PID constants by varying the fluid volume in the treatment bath of the original transfer function model;
  an input/output data storage configured to store a manipulated variable corresponding to temperature data obtained by the temperature sensor configured to measure the temperature of the fluid in the treatment bath every predetermined time when the PID-control calculator performs the PID control on the temperature adjuster with the PID constants calculated by the PID-constant calculator;
  a transfer function model selector configured to: calculate a deviation between an output result upon inputting the manipulated variable stored in the input/output data storage to each of the transfer function models generated by the transfer function model generator and the temperature of the fluid in the treatment bath stored in the input/output data storage; and select one of the transfer function models with a smallest deviation; and
  a transfer function model corrector configured to correct the original transfer function model with reference to the one of the transfer function models selected by the transfer function model selector, wherein
  the PID-constant calculator corrects the PID constants with reference to the original transfer function model corrected by the transfer function model corrector.

2. The temperature adjustment system for the semiconductor manufacturing apparatus according to claim 1, wherein the temperature adjuster is a halogen lamp heater comprising a closed sheath pipe in which halogen gas is contained and a filament is inserted.

3. The temperature adjustment system for the semiconductor manufacturing apparatus according to claim 1, wherein the temperature adjuster comprises a sheath heater comprising a sheath pipe in which a Nichrome wire is inserted.

4. The temperature adjustment system for the semiconductor manufacturing apparatus according to claim 1, wherein the temperature adjuster comprises a Peltier element.

5. A proportional integral derivative (PID)-constant calculating method for semiconductor manufacturing using a semiconductor temperature adjustment system for a semiconductor manufacturing apparatus, the temperature adjustment system being configured to adjust a temperature of a fluid used in the semiconductor manufacturing apparatus, the temperature adjustment system comprising a heat exchanger comprising therein a temperature adjuster for heating and cooling the fluid, the heat exchanger being configured to perform heat exchange between the fluid therein and the temperature adjuster, the semiconductor manufacturing apparatus being a closed-loop semiconductor manufacturing apparatus comprising a treatment bath for treating a semiconductor, the treatment bath being supplied with the fluid with the adjusted temperature, the fluid being recycled from the treatment bath after being used for treating the semiconductor and again subjected to a temperature adjustment, the method comprising calculating the PID-constants for PID control comprising a proportional gain (Kp), an integral time (Ti) and a derivative time (Td) from variables using a transfer function $G_1(s)$ represented by a formula (1) below, $$G_1(s) = \frac{(V1s+q)}{(\gamma V1s+q)} \cdot \frac{P(q-\alpha Vb)/\rho Cp}{(V1Vbs^2+(V1+Vb)qs+\alpha Vpq)} \cdot \frac{1}{(Tsen\, s+1)} \cdot e^{-Ls} \quad (1)$$

$(L = Vp/q)/q$ where the variables are:
  a capacity of the heat exchanger: V1 (m³);
  an output of the temperature adjuster: P (kW);

a coefficient matching a type of the temperature adjuster: γ (≥1);
a time constant of a temperature sensor: Tsen (sec);
a heat loss coefficient of the treatment bath: α (1/sec);
a circulation flow rate of the fluid: q (m³/sec);
a flow volume in the treatment bath: Vb (m³);
a specific heat of the fluid: Cp (J/(kg·K));
a density of the fluid: ρ (kg/m³);
a temperature setpoint of the fluid: Sv (K);
an ambient temperature around the apparatus: Tr (K); and
a capacity of a duct of the apparatus: Vp (m³).

6. A method for operating a temperature adjustment system for a semiconductor manufacturing apparatus, the temperature adjustment system being configured to adjust a temperature of a fluid used in the semiconductor manufacturing apparatus, the temperature adjustment system comprising a heat exchanger comprising therein a temperature adjuster for heating and cooling the fluid, the heat exchanger being configured to perform heat exchange between the fluid therein and the temperature adjuster, the semiconductor manufacturing apparatus being a closed-loop semiconductor manufacturing apparatus comprising a treatment bath for treating a semiconductor, the treatment bath being supplied with the fluid with the adjusted temperature, the fluid being recycled from the treatment bath after being used for treating the semiconductor and again subjected to a temperature adjustment, the method comprising:

calculating a proportional integral derivative (PID) constant for PID control comprising a proportional gain (Kp), an integral time (Ti) and a derivative time (Td) from variables using a transfer function $G_1(s)$ represented by a formula (1) below, $$G_1(s) = \frac{(V1s+q)}{(\gamma V1s+q)} \cdot \frac{P(q-\alpha Vb)/\rho Cp}{(V1Vbs^2+(V1+Vb)qs+\alpha Vpq)} \cdot \frac{1}{(Tsen\, s+1)} \cdot e^{-Ls} \quad (1)$$

$$(L = Vp/q)\square^{p/q}$$

where the variables are:
a capacity of the heat exchanger: V1 (m³);
an output of the temperature adjuster: P (kW);
a coefficient matching a type of the temperature adjuster: γ (≥1);
a time constant of a temperature sensor: Tsen (sec);
a heat loss coefficient of the treatment bath: α (1/sec);
a circulation flow rate of the fluid: q (m³/sec);
a flow volume in the treatment bath: Vb (m³);
a specific heat of the fluid: Cp (J/(kg·K));
a density of the fluid: ρ (kg/m³);
a temperature setpoint of the fluid: Sv (K);
an ambient temperature around the apparatus: Tr (K); and
a capacity of a duct of the apparatus: Vp (m³);
operating the temperature adjustment system for the semiconductor manufacturing apparatus with the calculated PID constants;
generating a plurality of transfer function models by varying the fluid volume Vb (m³) in the treatment bath of the formula (1);
measuring the temperature of the fluid in the treatment bath every predetermined time when the PID control is performed on the temperature adjuster with the PID constants calculated in the calculating of the PID constants;
calculating a deviation between an output result of each of the generated plurality of transfer function models and the measured temperature of the fluid in the treatment bath;
selecting one of the transfer function models with a smallest deviation; and
correcting the calculated PID constants with reference to the selected one of the transfer function models.

7. The method for operating the temperature adjustment system for the semiconductor manufacturing apparatus according to claim 6, further comprising:
acquiring an input manipulated variable for the temperature adjuster after the temperature of the fluid in the treatment bath is settled at the temperature setpoint; and
correcting the heat loss coefficient α of the treatment bath with the acquired input manipulated variable for the temperature adjuster.

* * * * *